United States Patent [19]

Chen

[11] Patent Number: 5,828,559
[45] Date of Patent: Oct. 27, 1998

[54] SOFT SWITCHING ACTIVE SNUBBER

[76] Inventor: Keming Chen, 7724 Camp Alger Ave., Falls Church, Va. 22042

[21] Appl. No.: 794,643

[22] Filed: Feb. 3, 1997

[51] Int. Cl.$^6$ ..................................................... H02H 7/12
[52] U.S. Cl. ............................................. 363/56; 363/132
[58] Field of Search ........................ 363/56–58, 131–134, 363/136–137, 66–68, 138, 20–21

[56] References Cited

U.S. PATENT DOCUMENTS

| | | | |
|---|---|---|---|
| 4,438,486 | 3/1984 | Ferraro | 363/56 |
| 4,899,270 | 2/1990 | Bond | 363/56 |
| 4,977,493 | 12/1990 | Smith | 363/126 |
| 5,055,990 | 10/1991 | Miki | 363/56 |
| 5,075,838 | 12/1991 | Schnetzka | 363/37 |
| 5,130,917 | 7/1992 | Shekhawat | 363/56 |
| 5,235,501 | 8/1993 | Stuart | 363/17 |
| 5,260,607 | 11/1993 | Kinbara | 307/253 |
| 5,379,206 | 1/1995 | Davidson | 363/55 |
| 5,414,613 | 5/1995 | Chen | 363/52 |

OTHER PUBLICATIONS

Angelo Ferraro, "An Overview of Low–Loss Snubber Technology For Transistor Converters", IEEE Power Electronics Specialists Conference, 1982, pp. 466–477.

Mosche Domb, Richard Redl, "Nondissipative Turn–off Snubber in a Forward Converter: Analysis, Design Procedure, and Experimental Verification", PCI Oct., 1985 Proceedings, pp. 54–68.

Koosuke Harada, Hiroshi Sakamoto, "Switched Snubber for High Frequency Switching", IEEE Power Electronics Specialists Conference, Aug. 1990, pp. 181–188.

A.R. Prasad, P.D. Ziogas, "Active Input Current Waveshaping Method for Three–phase Diode Rectifiers with Zero Switching Losses", IEEE/IAS Annual Meeting, May 1991, Conf. Record, pp. 932–938.

*Primary Examiner*—Aditya Krishnan

[57] ABSTRACT

A soft switching device for electric power switching applications includes a switching element and a soft switching active snubber. The soft switching active snubber includes a capacitor, a rectifier and a soft switching active reset circuit. The capacitor connects in series with the rectifier and both of which connects across the switching element. The soft switching active reset circuit, connected across the rectifier as well as the capacitor, is responsive to a reset signal for active resetting of the capacitor within the normal switching cycle of the switching element. Energy absorbed by the capacitor is recovered to the input voltage source or to the load. This occurs contemporaneous with the power switching operation of the switching element. With the active snubber, soft switching is provided for both the switching element and a snubber switch within the active reset circuit, for an efficient and reliable circuit operation. The active snubber also allows additional controls for implementing an intelligent soft switching device. The soft switching device is a complete self-contained circuit. Its operation does not depend on any external circuit components. It can be used as an efficient, reliable, versatile and intelligent power switch in any kind of power switching applications. The active snubber and soft switching device introduce a new type of standard component for power electronics. They can be used in series or in parallel. The active snubber can also provide stress relief for a diode, a switching circuit and a mechanical switch.

20 Claims, 20 Drawing Sheets

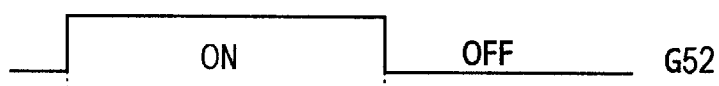
Fig. 3(a) — G52
Fig. 3(b) — G72
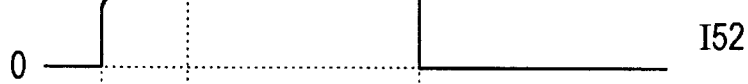
Fig. 3(c) — I52
Fig. 3(d) — V52
Fig. 3(e) — V62
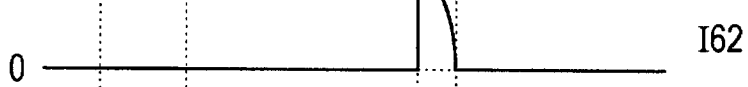
Fig. 3(f) — I62
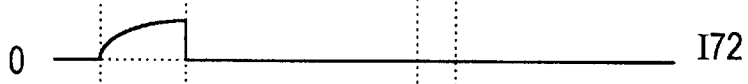
Fig. 3(g) — I72
Fig. 3(h) — V72
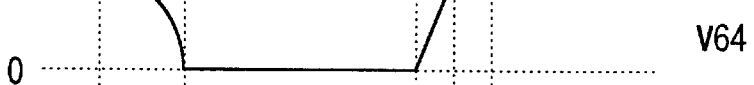
Fig. 3(i) — V64
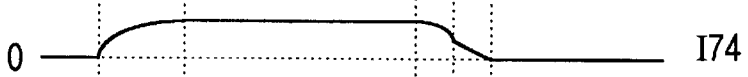
Fig. 3(j) — I74
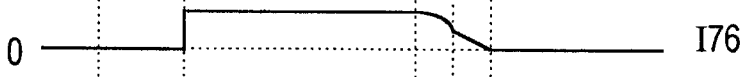
Fig. 3(k) — I76
t0  t1    t2 t3 t4

SOFT SWITCHING ACTIVE SNUBBER

FIELD OF INVENTION

This invention relates to snubber circuits for reducing switching stress of the switching circuits and, more particularly, to a switching element with an efficient and reliable soft switching active snubber for use in any kind of power switching applications.

BACKGROUND OF THE INVENTION

Snubbers are used to reduce switching stress of switching element. The stress includes current surge, voltage spike and switching losses when the switching element turns on, (turn-on loss) and turns off (turn-off loss). The current surge due to reverse recovery current of a free wheeling diode occurs when the switching element turns on. The voltage spike due to wire and circuit parasitic inductance occurs when the switching element turns off. A complete snubber circuit includes two basic parts. A turn-on snubber allows voltage across the switching element to drop before current starts to increase when the switching element turns on. The result is a substantial reduction of the turn-on loss due to the voltage and current cross-over. It also limits the rate of rise of the current, and thereby suppresses the current surge. A turn-off snubber reduces the switching turn-off loss and the voltage spike by reducing rate of the voltage increase. There are at least two essential parts in any snubber circuit: an absorbing circuit and a resetting circuit. The simplest form of the absorbing circuit for the turn-on snubber is an inductor in series with the switching element. The simplest form of the absorbing circuit for the turn-off snubber is a capacitor in parallel with the switching element. Most snubber circuits distinguish themselves from others by difference of their resetting circuits.

Conventional dissipative snubber such as a RCD snubber uses a resistor to dissipate the energy in the absorbing circuit to reset the absorbing circuit for the next operating cycle. Such an arrangement provides both turn-off loss reduction and damping of voltage oscillations across the switching element. But it incurs a relatively high power loss, and therefore is not suitable for high-power and high-frequency power conversion applications. Another dissipative snubber, described in Hiroshi Miki, et al., U.S. Pat. No. 5,055,990 (1991), uses a Zener diode as a dissipative element to reduce the voltage spike across the switching element. However, this arrangement does not provide the switching loss reduction.

Other alternative approaches use non-dissipative passive resetting elements. As best illustrated by Angelo Ferraro, "An Overview of Low-Loss Snubber Technology For Transistor Converters", IEEE PESC Conference, 1982 Record, pp. 466–477; Moshe Domb, et al., "Nondissipative Turn-off Snubber in a Forward Converter: Analysis, Design Procedure, and Experimental Verification", PCI October 1985 Proceedings, pp. 54–68; U.S. Pat. Nos. 5,260,607 (1993); and 4,977,493 (1990), all the snubber circuits above suffer from a common drawback. Their turn-off absorbing circuits do not connect directly across the switching element. This is not a desirable characteristic in high-power high-frequency power conversion applications due to the limitation of size and wiring parasitic inductance.

Another approach described in U.S. Pat. No. 5,075,838 (1991) also uses a passive resetting circuit. It has an absorbing circuit connected directly across the switching element. However, this circuit is intended for use in half-bridge high power GTO circuit in low frequency application. This is because, in one embodiment of this invention, a transformer with a resetting voltage of 1.4V requires a long resetting time. In another embodiment, a capacitor inserted in the primary side of the transformer speeds up the resetting process. But this capacitor cannot be reset without a resistor in parallel for dissipating all of its absorbed energy. This loss makes it unsuitable for high-frequency power conversion applications.

A different approach is described in U.S. Pat. No. 4,899,270 (1990). In this circuit, the snubber diode and capacitor are rated for the full power of the converter circuit, since the snubber circuit is integrated with other part of the circuit as power transfer component. Furthermore soft switching is not provided by the snubber circuit for effective switching loss reduction.

Many active snubber circuits are introduced to solve the problems associated with the passive snubber circuits. In this type of snubber circuits a second or more switching elements are introduced in absorbing or resetting circuit. A snubber circuit with an active absorbing circuit is described in U.S. Pat. No. 5,130,917 (1992). In most snubber circuits, a full load current is transferred to the absorbing circuit when the main switching element is turned off. It is therefore not desirable to have the snubber switching element to carry the full load current, since its sole purpose is to relieve the stress on the main switching element.

Other snubber circuits using active resetting circuits are described in Angelo Ferraro, "An Overview of Low-Loss Snubber Technology For Transistor Converters", IEEE PESC Conference, 1982 Record, pp. 466–477; U.S. Pat. Nos. 4,438,486 (1984); and 5,379,206 (1995). A second switching element is used to recover the trapped energy in the absorbing circuit. Even though the second switching element is designed to carry a fraction of the full load current, the stress on the second switching element and the reliability of the snubber circuit become an issue. To deal with this issue, many soft switching snubber circuits with stress relief for the second switching element have been developed. A soft switching active snubber circuit, representing one class of the soft switching active snubber circuits, is described in Koosuke Harada, et al., "Switched Snubber for High Frequency Switching", IEEE PESC Conference Record August 1990, pp. 181–188. In this circuit the energy in the snubber circuit is not minimized. A peak current as high as the full load current is carried by the second switching element in the snubber circuit. To maintain the soft switching conditions for both switching elements, the current in the free wheeling diode is doubled. A large reverse current in the main switching element is also induced, which is not part of the circuit operation for power conversion. The utilization of the main circuit for power conversion is reduced when extra operations are added to the main circuit operation by the snubber circuit.

A soft switching power converter described in U.S. Pat. No. 5,235,501 (1993) integrates the snubber circuit and its operation naturally with the main power transfer circuit. The main switching elements in the circuit provide the soft switching conditions for each other when they perform the power transfer function. The energy in the snubber circuit is minimized. However, due to the high integration, the use of this type of snubber circuit is limited to only suitable applications. Also this type of soft switching circuit has limited operating range while soft switching characteristic is maintained. The reliability of the switching elements will be a concern again if the soft switching conditions are lost.

In the soft switching active snubber circuit described by A. R. Prasad, et al., "Active Input Current Waveshaping Method for Three-Phase Diode Rectifiers with Zero Switching Losses", IEEE/IAS Annual Meeting, May 1991, Conference Record, pp. 932–938, two isolation diodes are used to prevent the discharge of the snubber capacitor by the main switching elements themselves and help to create soft switching conditions for the two main switching elements. However these diodes are in the main current path. For high power application this will complicate the circuit assembly and add more losses. It is not desirable to place any snubber circuit elements in the main current path.

In my previous invention U.S. Pat. No. 5,414,613 (1995), a new soft switching active snubber is proposed to solve the problems associated with the above snubber circuits. Due to the requirement of its resetting circuit, the best applications for this circuit are semiconductor circuits operated in discontinuous conduction mode. Furthermore, since the soft switching condition for the snubber switching element is not provided by the snubber circuit elements themselves, the application of this snubber circuit is limited in only certain type of power conversion circuits.

Accordingly, an optimum snubber circuit should include a turn-on and a turn-off snubber. Its operation should not depend on other part of the circuit in the power converter. It should have the soft switching characteristic for all of its switching elements. The energy in the snubber circuit should be minimized. The turn-off absorbing element should connect directly across the main switching element, and the snubber circuit elements should not be in the main current path. Finally the snubber circuit should work reliably under any operating conditions.

It is therefore an object of this invention to provide an optimum snubber circuit that is a versatile, efficient, reliable and intelligent snubber circuit.

It is an another object of this invention to provide a soft switching device that can be used in any applications where a switching element is needed.

Further objects and advantages will become apparent from the following description and drawings.

SUMMARY OF THE INVENTION

The present invention overcomes the problems and disadvantages of the prior arts by providing a soft switching active snubber for use with any switching devices and electric circuits.

According to one embodiment of the invention, the soft switching active snubber comprises a series combination of a rectifier and a capacitor, coupled across a switching element. It provides a soft switching turn-off characteristic for the switching element. It also provides a protection against voltage spike across the switching element. A soft switching active reset circuit coupled to the rectifier and the capacitor includes a series combination of an inductor and a snubber switching element, coupled across the rectifier to provide a controllable discharging path to reset the capacitor, a clamping diode coupled between a connection point of the inductor and the snubber switching element, and a connection point of the switching element and the capacitor, to provide a soft switching turn-off characteristic for the snubber switching element and a path to recover the energy transferred to the inductor during the discharging process of the capacitor.

The soft switching active snubber of the present invention introduces a new standard component for the power electronics. The new active snubber component can be used in series or in parallel. The additional switching element in the active snubber allows more control and intelligence to be added so that optimum snubber operation is provided.

According to another embodiment of the invention, a turn-on snubber is provided wherein a second inductor is coupled in series with the switching element, and a circling diode is coupled across the switching element and the second inductor. The current surge due to the diode reverse recovery and the turn-on switching loss of the switching element are substantially reduced by the turn-on snubber.

According to a further embodiment of the invention, a soft switching device is provided for use in any kind of the power converters where an efficient and reliable switching device is needed, wherein the soft switching active snubber attaches to a power semiconductor switching element and ensures a controllable, efficient and reliable soft switching turn-off characteristic to the power semiconductor switching element.

This invention, soft switch for power switching applications, provides a true stand-alone soft switching device that can be used in any types of power conversion circuits without any modification in either soft switching device or power conversion circuit. Since it does not require any change in basic circuit operation or circuit structure and wiring, it can be used as a direct replacement part in an existing circuit to improve system efficiency and reliability. Additionally, due to a controllable soft switching resetting characteristic, addition controls can be added in responsive to various needs in many different power conversion circuits. This makes the soft switching device even easier and flexible to use in a new power conversion circuit design.

The accompanying drawings, which are incorporated in and constitute a part of this invention, illustrate embodiments of the invention and, together with the description, serve to explain the principles of the invention.

BRIEF DESCRIPTION OF THE DRAWINGS

FIGS. 3(a)–(k) are illustrative current and voltage waveforms helpful in explaining the operation of FIG. 1;

DETAILED DESCRIPTION OF THE PREFERRED EMBODIMENTS

Figure 1:
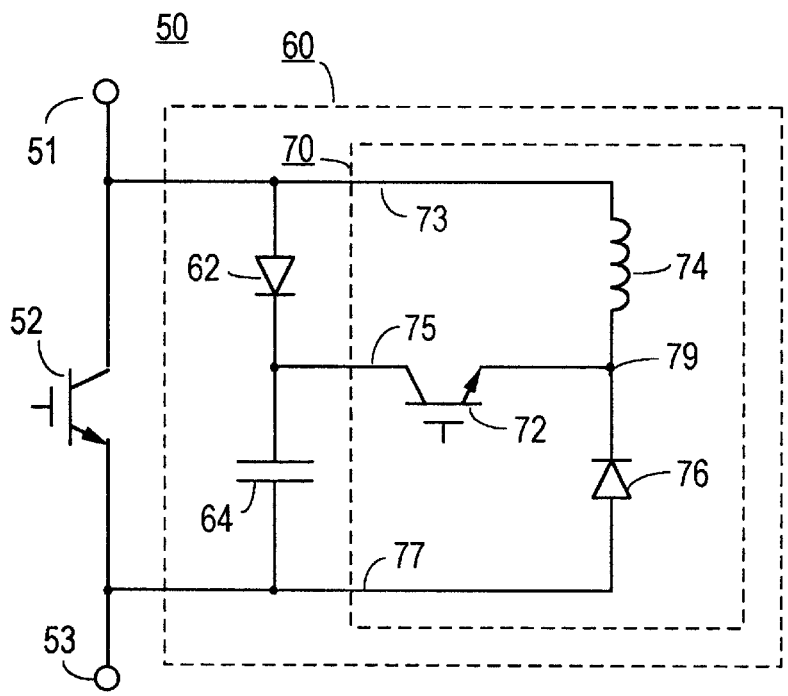
FIG. 1 is a circuit diagram of a soft switching active snubber with a switching element, or a soft switch according to the invention.

A first embodiment will now be described in reference to FIG. 1. A soft switching active snubber 60 providing stress relief for a switching element 52 is illustrated in FIG. 1. Switch 52 shown in FIG. 1 is an IGBT but GTO, BJT, MOSFET, MCT, SIT and other similar switching devices can also be protected by the invention. Active snubber 60 comprises an absorbing circuit or a current bypass path. The absorbing circuit includes a rectifier 62 in series with a capacitor 64, to provide the current bypass path when switch 52 is turned off. The absorbing circuit is coupled directly across switch 52. Rectifier 62 shown in FIG. 1 is a diode but a SCR and other similar rectifier can also be used. Active snubber 60 further includes a soft switching active reset circuit 70 with a first terminal 73, a second terminal 75 and a third terminal 77 coupled to the absorbing circuit. A controllable discharge path is provided to discharge capacitor 64. The discharge path coupled across rectifier 62 comprises a snubber switching element 72 in series with an inductor element 74. Snubber switch 72 shown in FIG. 1 is an IGBT but SCR, GTO, BJT, MOSFET, MCT, SIT and other similar switching devices can also be used. Snubber switch 72 turns on to discharge capacitor 64 while switch 52 is on. A clamping diode 76 couples between third terminal 77 and a connection point 79 to provide a soft switching turn-off characteristic for snubber switch 72 and a path to recover the energy transferred to inductor 74 during the discharging process of capacitor 64.

The combination of switch 52 and active snubber 60 represents a new class of switching element defined as a soft switching element or a soft switch. Soft switch 50 shown in FIG. 1 has an input terminal 51 and an output terminal 53. According to the invention, soft switch 50 can be used as a switching element in any types of power switching applications.

The detail operation of soft switch 50 in FIG. 1 will now be explained with reference to the waveforms in FIGS. 3(a)–(k). Assume that the initial inductor current I74 is zero, snubber switch 72 is off and capacitor voltage V64 has an initial voltage. At time t0, switch 52 turns on to conduct a load current from input terminal 51 to output terminal 53, and snubber switch 72 also turns on to start the discharging process of active snubber 60. Capacitor 64 discharges through snubber switch 72, inductor 74 and switch 52 until capacitor voltage V64 reaches zero at time t1. Clamping diode 76 conducts and clamps capacitor voltage V64 to zero at time t1. Inductor current I74 now circulates through clamping diode 76 and switch 52, until both switches 52 and 72 turn off at time t2. Notice that snubber switch 72 turns off with zero-current and zero-voltage. The load current from input terminal 51 and the current in inductor 74, both carried by switch 52, are now bypassed to capacitor 64 through rectifier 62. Switch 52 turns off with a zero-voltage soft switching characteristic. The load current and the current in inductor 74 continue to charge capacitor 64 until capacitor voltage V64 reaches a full off-state voltage. The remaining energy in inductor 74 causes a reverse current to flow from output terminal 53 to input terminal 51 through clamping diode 76. The voltage source blocked by switch 52 recovers the energy. Once the energy is recovered completely, inductor current I74 reduces to zero at t4. The next switching cycle begins with the turn on of switches 52 and 72. Notice that snubber switch 72 turns on with a zero-voltage and zero-current soft switching characteristic.

In theory, rectifier 62 can also conduct at time t1. In this case inductor current I74 will also circulate through rectifier 62 and snubber switch 72. In practice, to minimize the stress and the cost of the snubber circuit, components can be selected to minimize the current in snubber switch 72 after time t1. In fact, since rectifier 62 needs to have much high current rating than clamping diode 76, clamping diode 76 will turn on with much faster speed and much less forward recovery voltage and time.

In power convert applications, most of the power converter's basic circuit operations can be characterized as either buck type or boost type. For use only as examples to explain the basic operation, soft switch 50 is employed to a buck and a boost converter as shown in FIGS. 4 and 5 respectively.

Figure 4:
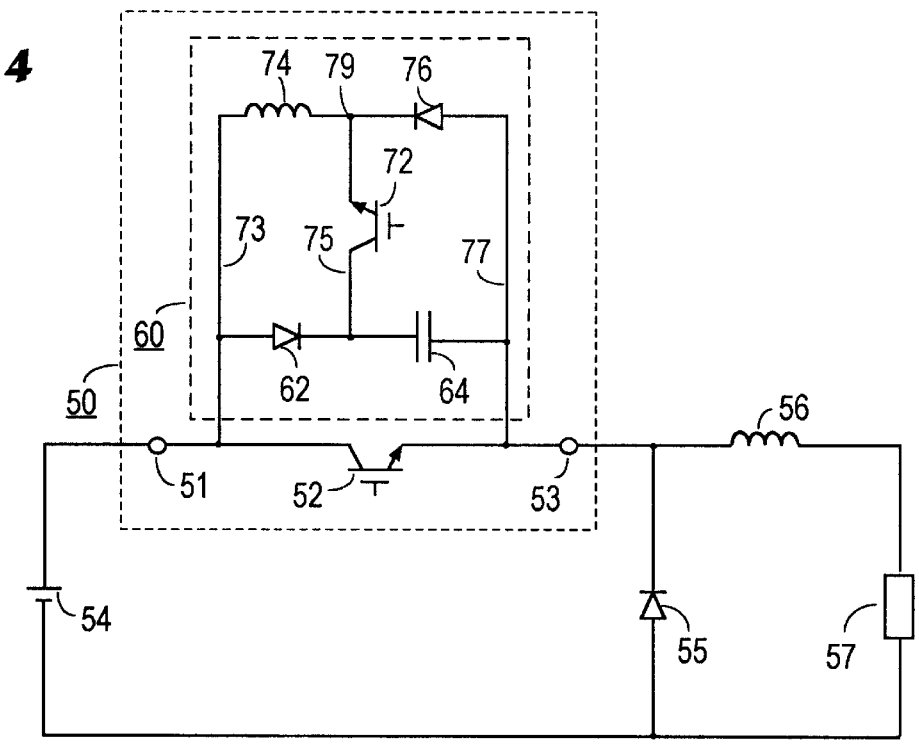
FIG. 4 illustrates a buck converter employing the soft switch of FIG. 1.

In FIG. 4 soft switch 50 is employed in the buck converter. Input terminal 51 is coupled to an input source 54 and output terminal 53 is coupled to a load 57 through a filter inductor 56. When switch 52 is turned on, power is delivered from source 54 to load 57. When switch 52 is off, a free wheeling diode 55 conducts and keeps current in filter inductor 56 continuously flowing to load 57. Source 54 is blocked by switch 52 from load 57. Diode 55 clamps capacitor voltage V64 to the voltage of source 54. The remaining energy in inductor 74 is returned to source 54 through diodes 76 and 55.

Figure 5:
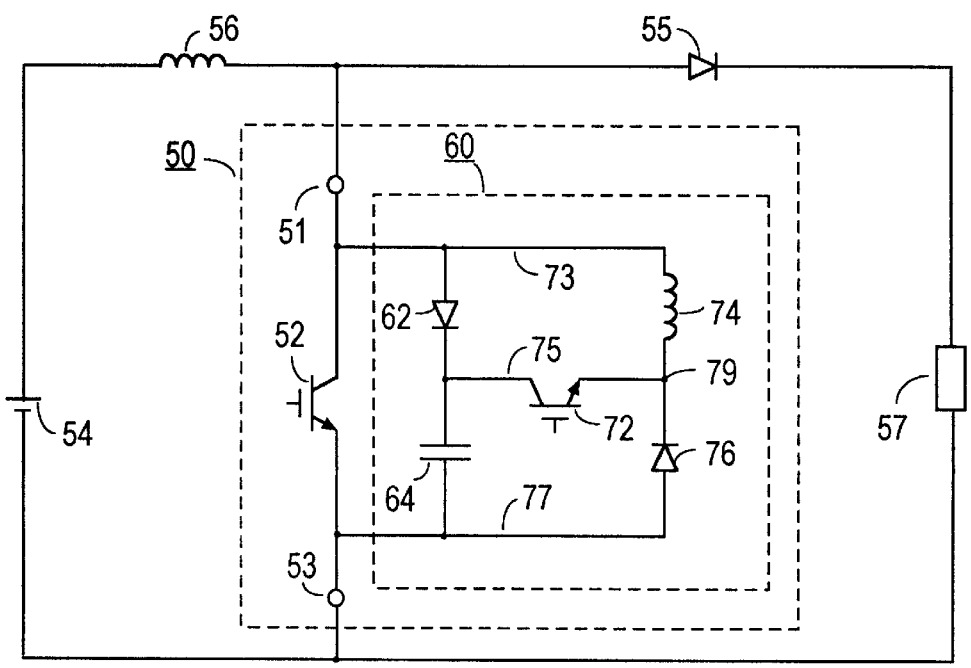
FIG. 5 illustrates a boost converter employing the soft switch of FIG. 1.

In FIG. 5 soft switch 50 is employed in the boost converter. Power is drawn from source 54 to filter inductor 56 when switch 52 is turned on. When switch 52 is turned off, power is delivered to load 57 through diode 55. Diode 55 clamps capacitor voltage V64 to the voltage of load 57. The remaining energy in inductor 74 is transferred to load 57 through diodes 76 and 55.

There are four unique features that make soft switch 50 reliable, efficient, versatile and easy to use in the practice. First, when active snubber 60 works in its normal operating mode, snubber switch 72 has no switching loss since it is turned on and off with zero-voltage and zero-current characteristic. Most of the time the voltage across snubber switch 72 is kept at zero except during a short period from t2 to t4. These make soft switch 50 reliable and efficient. Second, it is clear from above detail description. Active snubber 60 interacts with switch 52 to provide soft switching characteristic for both switch 52 and snubber switch 72, without any interaction from other converter circuit components. The snubber operation is basically independent of the converter power delivery operation. This makes soft switch 50 versatile to use as a switching element in any switching converters or power switching applications. Soft switch 50 can also be used in series or in parallel operation. Third, snubber switch 72 allows more control to the snubber. More intelligent features can be added to soft switch 50. Fourth, like all other capacitive turn-off snubbers an extra operation mode is added to the power converting operation of the switch as shown in FIG. 3 by the duration t2 to t3, which is only a small fraction of one switching cycle at a full load condition. At light load this duration can become substantially large, since capacitor 64 takes longer time to charge with a smaller current. In active snubber 60, however, capacitor 64 is also charged by the current from inductor 74 before the capacitor voltage reaches the full off-state voltage. This provides some compensation at light load and makes the increase of duration t2 to t3 to be controllable by the design and control of the active snubber 60.

Figure 2:
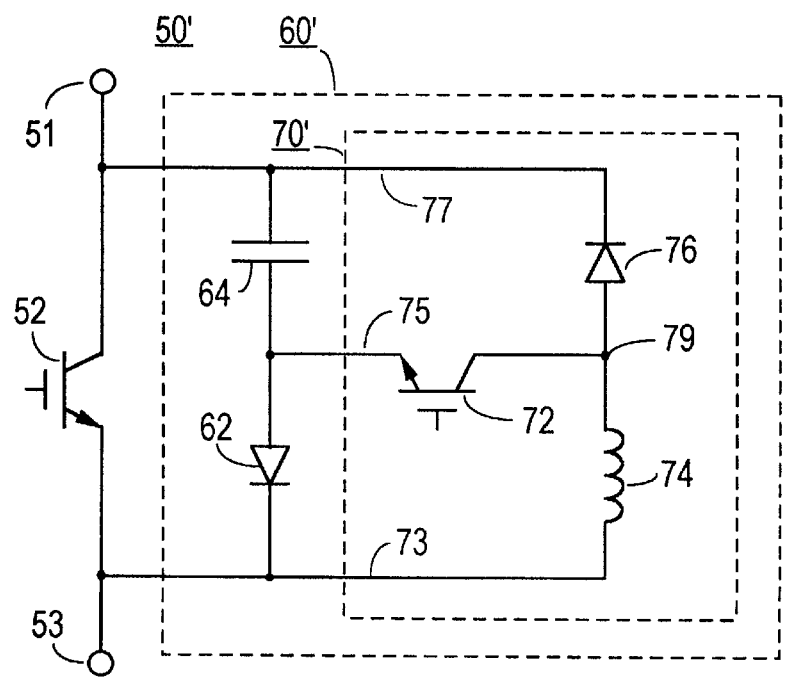
FIG. 2 is a circuit diagram of an electronically equivalent circuit or a dual-circuit of FIG. 1.

A second embodiment reference to FIG. 2 is an electronically equivalent circuit or a dual-circuit of FIG. 1. The differences between FIG. 1 and FIG. 2 are that the placements of rectifier 62 and capacitor 64 are swapped, and the placements of inductor 74 and clamping diode 76 are swapped. The direction of snubber switch 72 is also swapped to reflect the change of discharging current direction. Soft switch 50', of FIG. 2 operates substantially identical to soft switch 50 of FIG. 1.

Figure 6:
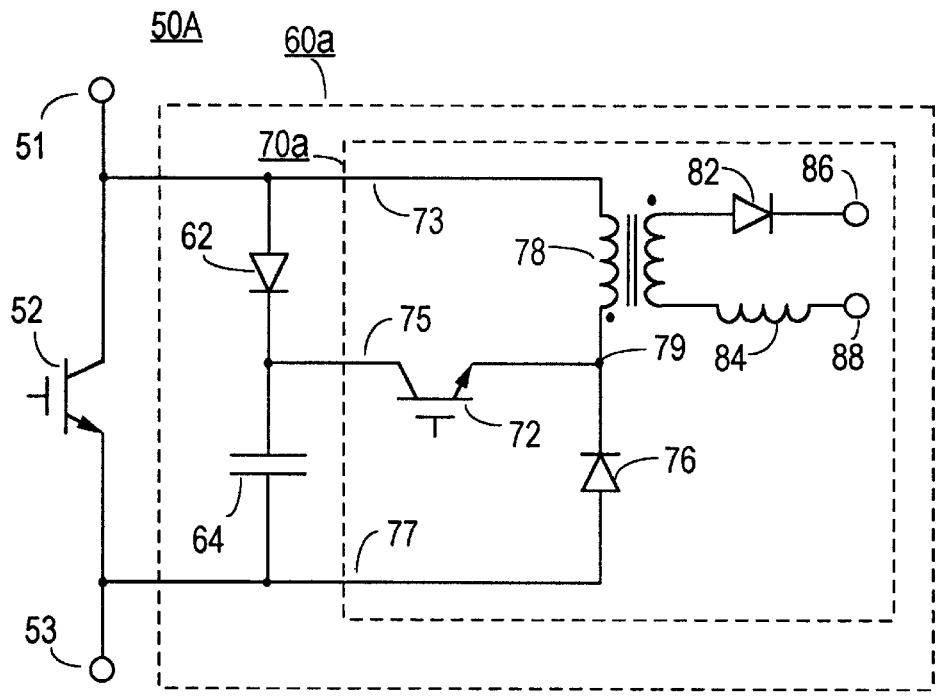
FIG. 6 shows a soft switch with a transformer recovering circuit.

Another embodiment of the present invention is shown in FIG. 6. Elements 52, 62, 64, 72 and 76 are connected same as described in FIG. 1. A primary winding of a transformer 78 replaces inductor element 74. The dotted end of the primary winding of transformer 78 connects to connection point 79. The dotted end of a secondary winding of transformer 78 connects to an input of a secondary diode 82. A positive terminal 86 connects to an output of diode 82 for connecting to an external voltage source or a load. The other end of secondary winding of transformer 78 connects to a secondary inductor 84. A negative terminal connects to inductor 84 for connecting to the external voltage source or the load. The dots on the transformer winding adhere to the convention that the dotted ends of the transformer will have the same relative polarity of voltage at the same time.

Figure 8:
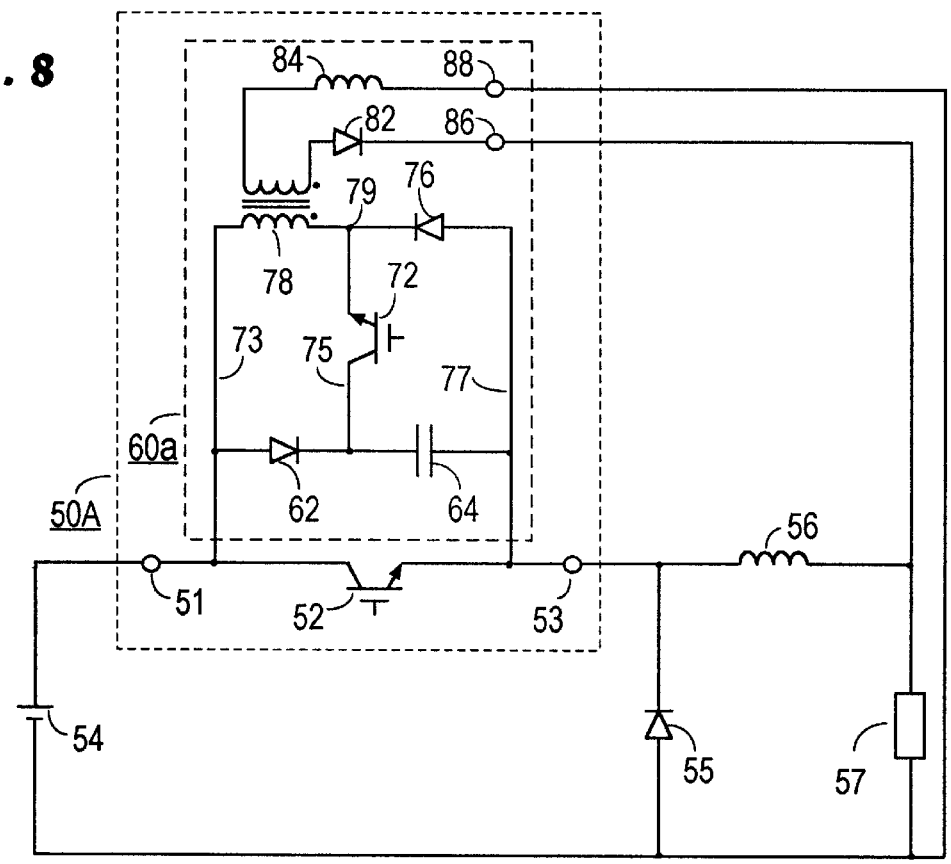
FIG. 8 illustrates a buck converter employing the soft switch of FIG. 6.

In FIG. 8 soft switch 50A is employed in the buck converter. Terminals 86 and 88 connect to load 57. The detail operation of soft switch 50A will now be explained with reference to the waveforms in FIGS. 10(a)–(k). Assume that the voltage of source 54 is substantially higher than the voltage of load 57, or transformer 78 has a proper turns ratio such that the secondary voltage of the transformer is substantially higher than the primary voltage of the transformer. Both switch 52 and snubber switch 72 turn at time t0. Capacitor 64 discharges through snubber switch 72, the primary winding of transformer 78 and switch 52. At time t1, capacitor voltage V64 reaches a voltage such that the voltage across inductor 84 is zero. The current in the transformer keeps flowing by inductor 84. At time t2, capacitor voltage V64 discharges to zero, clamping diode 76 conducts and clamps capacitor voltage V64 at zero. The reflect inductor current I84 in the primary winding of transformer 78 now circulates through clamping diode 76 and switch 52, until the energy in inductor 84 is completely recovered to load 57 at time t3. A small magnetizing current of transformer 78 keeps circulating through diode 76 and switch 52 until both switches 52 and 72 turn off at time t4.

Figure 10:
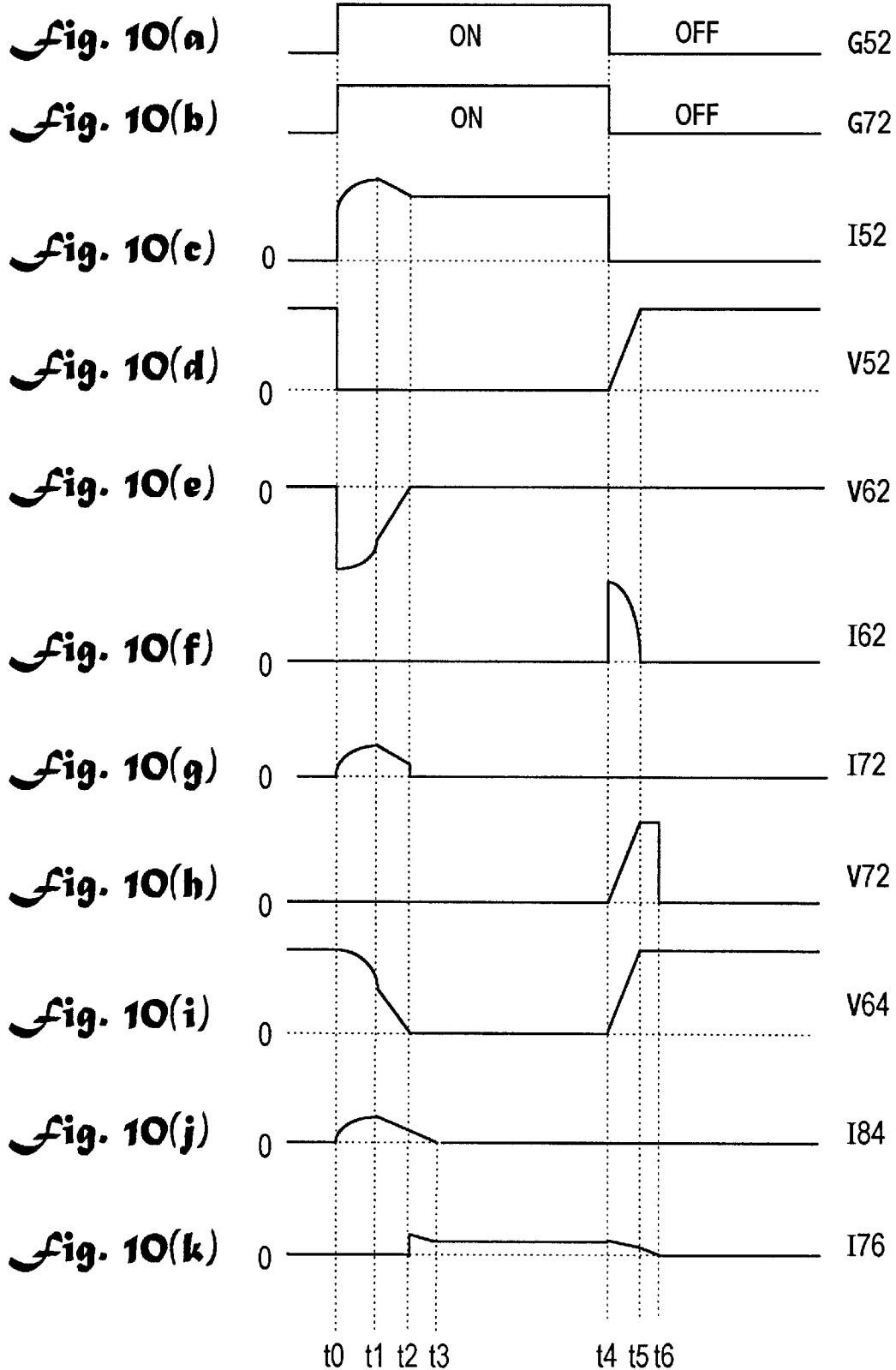
FIGS. 10(a)–(k) are illustrative current and voltage waveforms helpful in explaining the operation of FIG. 6.

The differences between soft switch 50 and soft switch 50A are as follows. In soft switch 50A, the discharging and energy recovering process of capacitor 64 occur simultaneously. As shown in FIG. 10, the discharging process starts at time t0 and ends at time t2. The recovering process starts at time t0 and ends at time t3. Since most of the energy in capacitor 64 is recovered to load 57 during turn-on recovering process, the circulating current in switch 52 and diode 76 in soft switch 50A is substantially smaller than that in soft switch 50. The energy represented by the small magnetizing current of transformer 78 is recovered to source 54 during time t5 to t6. This recovering time is substantially shorter than that in soft switch 50.

Figure 9:
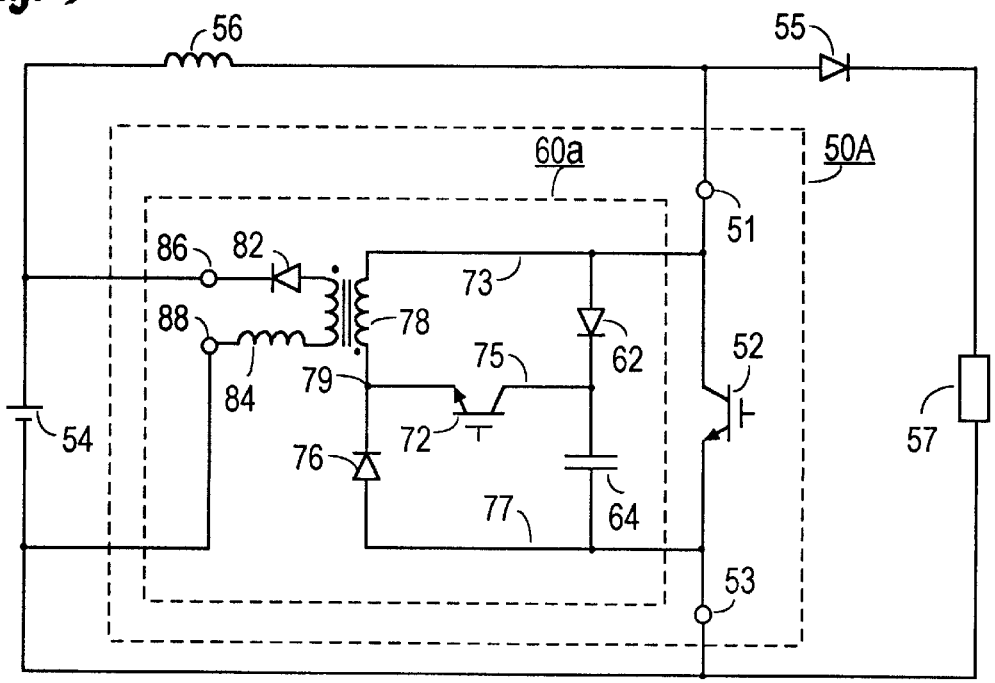
FIG. 9 illustrates a boost converter employing the soft switch of FIG. 6.

In FIG. 9 soft switch 50A is employed in the boost converter. Most of the energy in capacitor 64 is recovered to source 54 through transformer 78 while switch 52 is turned on. Transformer 78 is completely reset when the energy in the magnetizing inductance of transformer 78 is fully recovered to load 57 through diodes 76 and 55.

Figure 7:
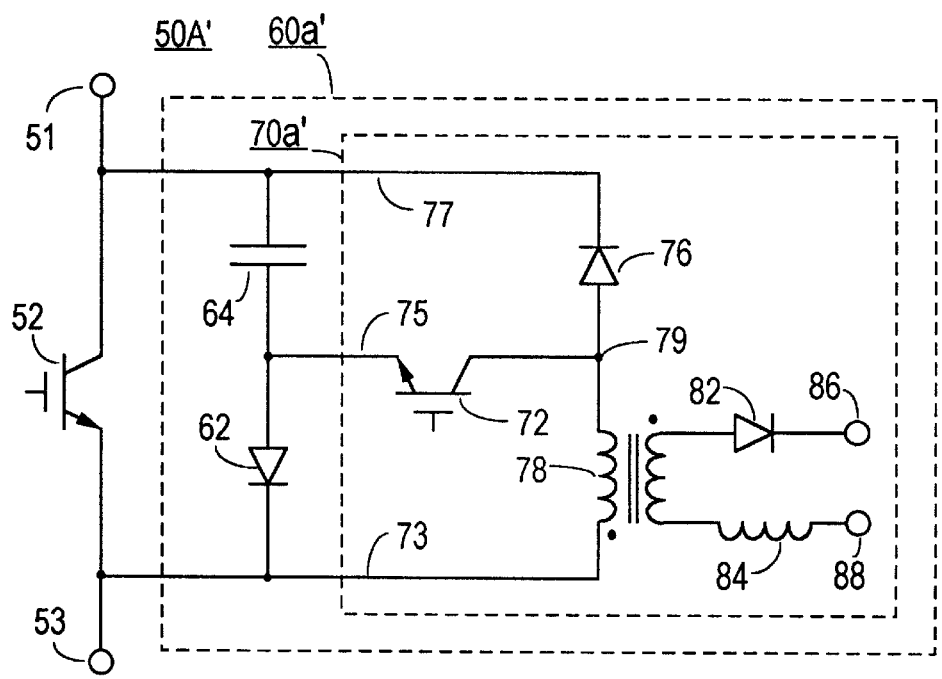
FIG. 7 is an electronically equivalent circuit or a dual-circuit of FIG. 6.

FIG. 7 is an electronically equivalent circuit or a dual-circuit of FIG. 6. The differences between FIG. 6 and FIG. 7 are that the placements of rectifier 62 and capacitor 64 are swapped, and the placements of transformer 78 and clamping diode 76 are swapped. The direction of snubber switch 72 and primary winding of transformer 78 are also swapped to reflect the change of discharging current direction. Soft switch 50A' of FIG. 7 operates substantially identical to soft switch 50A of FIG. 6.

Figure 11:
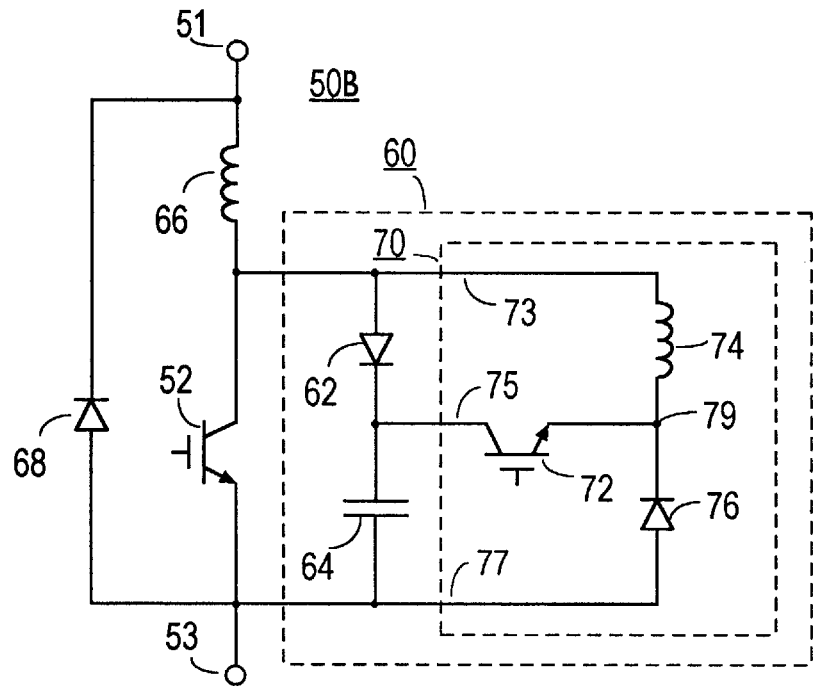
FIG. 11 shows a soft switch with a turn-on snubber.

Referring now to FIG. 11, a soft switch 50B with a turn-on snubber is shown. The turn-on snubber includes a second inductor element 66, connected in series with switch 52, and a circling diode 68 connected across inductor 66 and switch 52.

Figure 13:
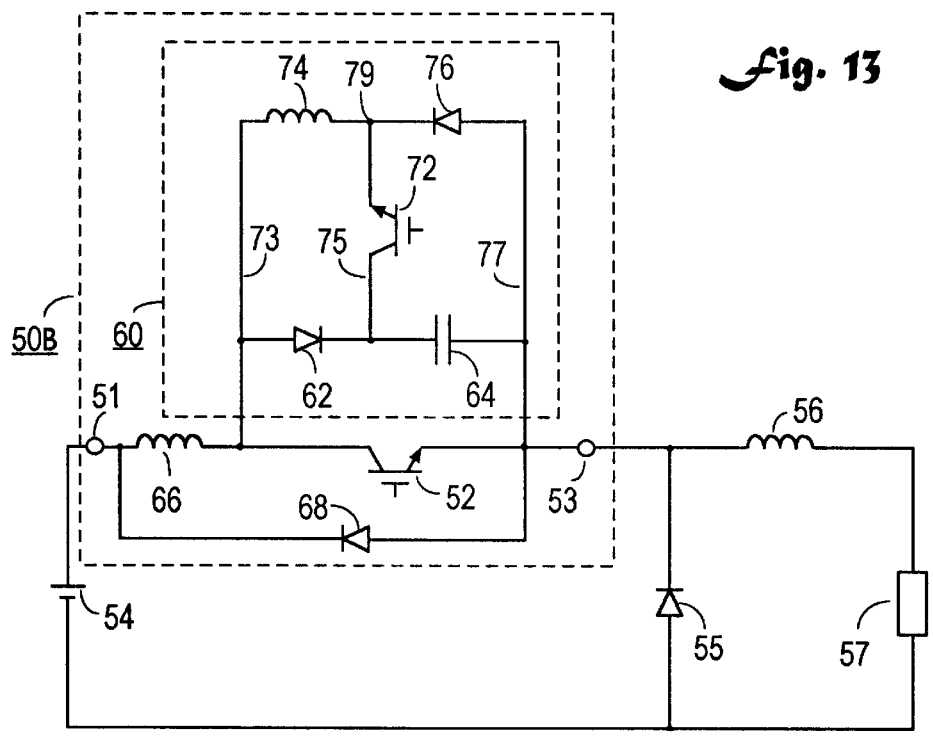
FIG. 13 illustrates a buck converter employing the soft switch of FIG. 11.
Figure 14:
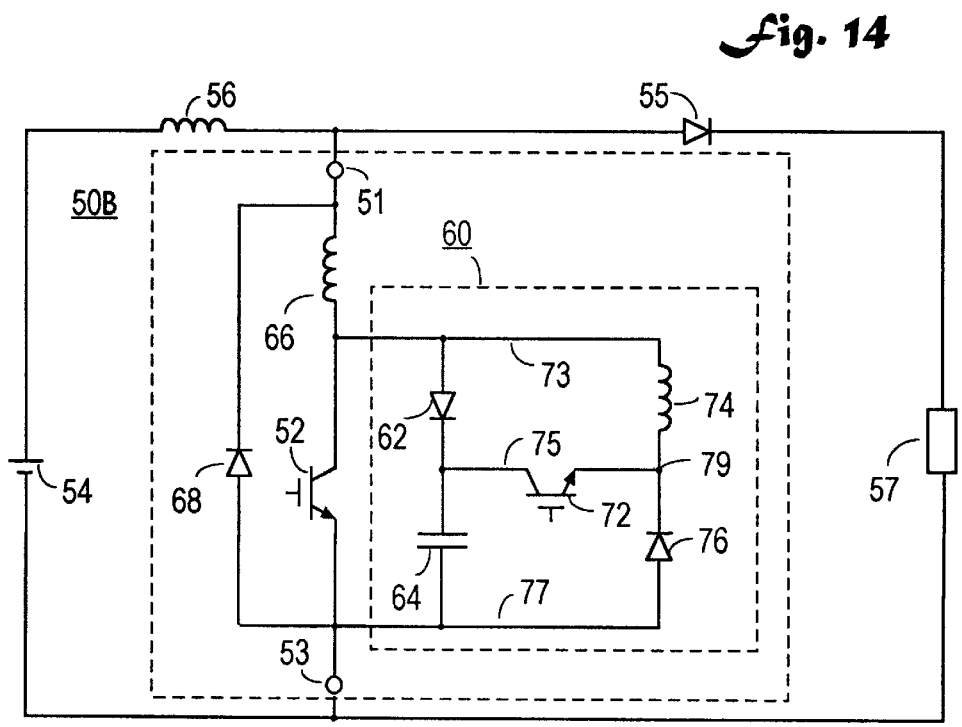
FIG. 14 illustrates a boost converter employing the soft switch of FIG. 11.

The detail operation of soft switch 50B will now be explained with reference to FIGS. 13 and 14, where soft switch 50B is employed to the buck and the boost converter respectively. Assume that initially current in inductor 66 is zero and the load current in inductor 56 flows to the load 57 through diode 55. When switch 52 turns on, inductor 66 limits the rate of rise of current while allowing the voltage across switch 52 to drop rapidly. As a result, the turn-on loss of switch 52 due to voltage and current cross-over is substantially reduced. When the current in inductor 66 equals to the current in filter inductor 56, diode 55 becomes reverse conducted due to the reverse recovery. The reverse recovery current is limited by inductor 66 and the current surge is substantially reduced. When diode 55 is completely turned off, the excess current in inductor 66 will be carried by circling diode 68. The discharging process of active snubber 60 is the same as described in FIG. 1. When switch 52 is turned off, the energy in inductor 66 will be absorbed by capacitor 64. As a result the full off-state voltage of switch 52 will not be clamped. A higher but well-defined off-state voltage will be established until a reverse current in inductor 66 equal to the current in inductor 74 is established. Once the energy in inductors 66 and 74 is completely recovered, the full off-state voltage of switch 52 will be clamped at the voltage of source 54 in the buck converter or at the voltage of load 57 in the boost converter.

Figure 12:
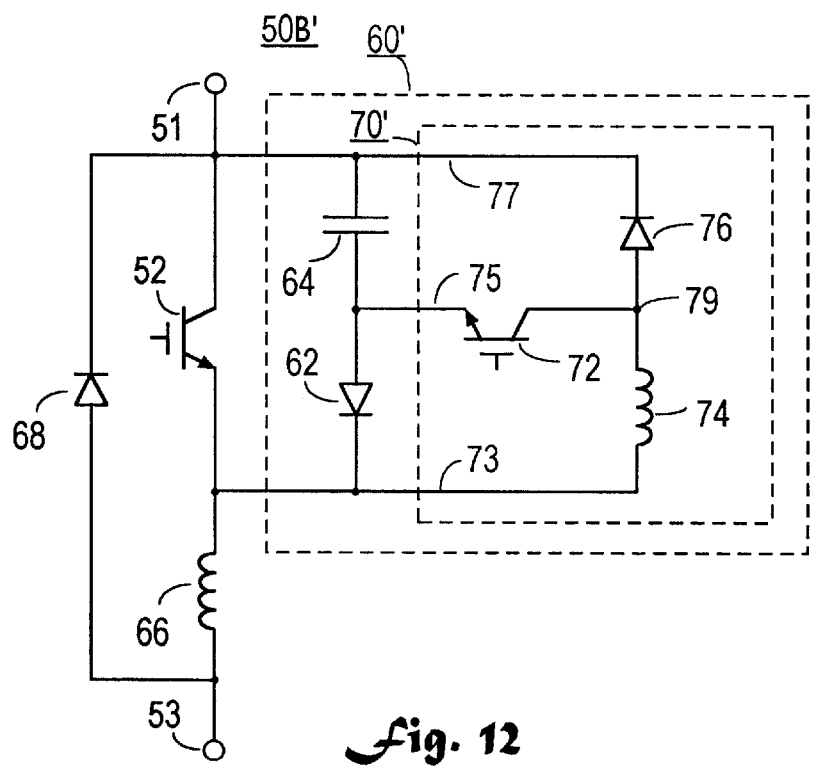
FIG. 12 is an electronically equivalent circuit or a dual-circuit of FIG. 11.

FIG. 12 shows an electronically equivalent circuit or a dual-circuit of FIG. 11. The differences between FIG. 11 and FIG. 12 are that active snubber 60' replaces active snubber 60, and the placements of inductor 66 and switch 52 are swapped. Soft switch 50B' of FIG. 12 operates substantially identical to soft switch 50B of FIG. 11.

Second inductor element 66 shown in FIGS. 11 and 12 is an inductor. A saturable inductor can be used to minimize the energy in the turn-on snubber elements, and to reduce the voltage applied to switch 52 when switch 52 is turned off.

Figure 15:
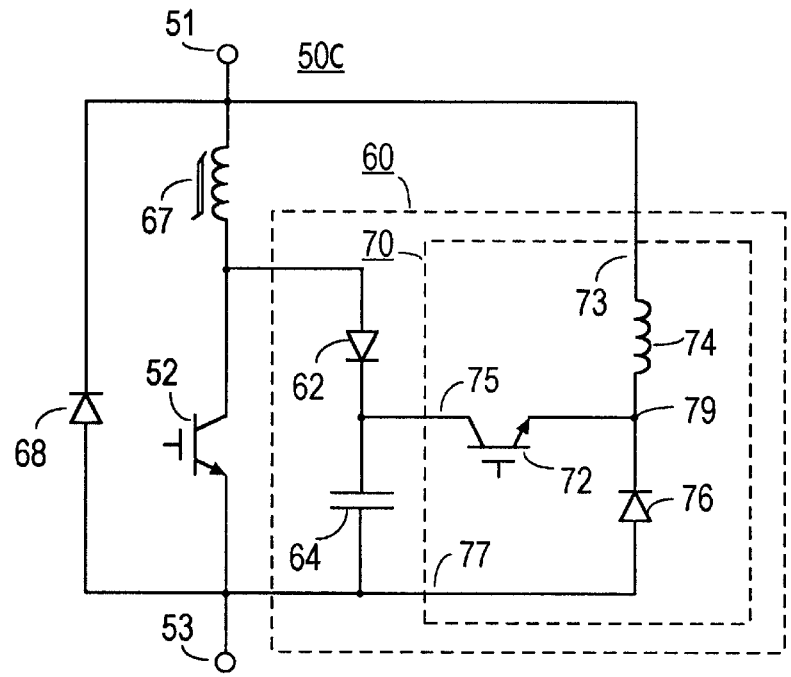
FIG. 15 shows a soft switch with a saturable inductor turn-on snubber.

FIG. 15 shows a soft switch 50C. Elements 52, 62, 64, 68, 72 and 76 are connected same as described in FIG. 11. In addition, inductor 74 is connected between connection point 79 and input terminal 51. A saturable inductor 67 replaces inductor 66.

Figure 16:
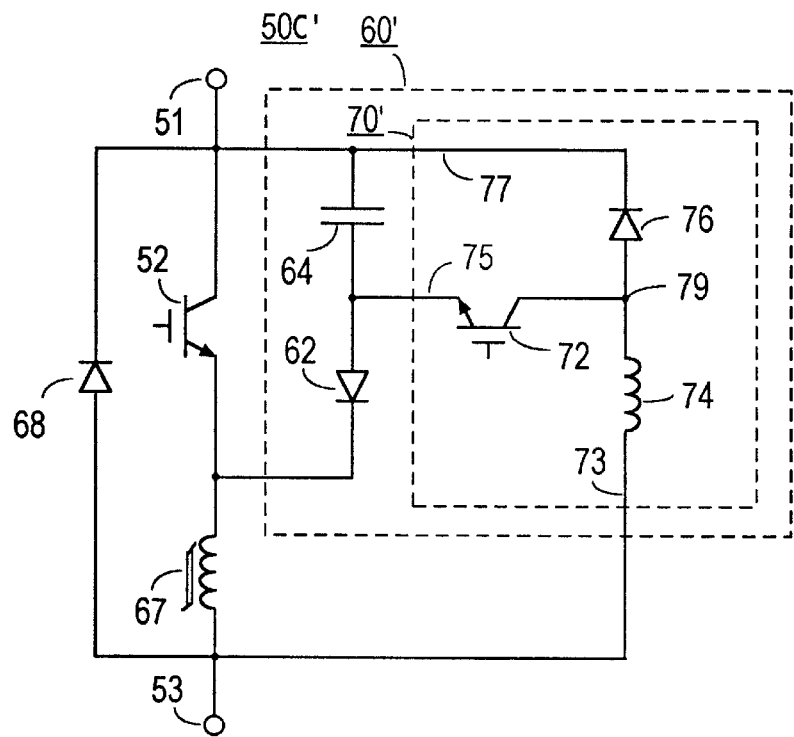
FIG. 16 is an electronically equivalent circuit or a dual-circuit of FIG. 15.

FIG. 16 shows an electronically equivalent circuit or a dual-circuit of FIG. 15. Elements 52, 62, 64, 68, 72 and 76 are connected same as described in FIG. 12. In addition, inductor 74 is connected between connection point 79 and output terminal 53. A saturable inductor 67 replaces inductor 66. Soft switch 50C of FIG. 15 operates substantially identical to soft switch 50C' of FIG. 16.

Figure 19:
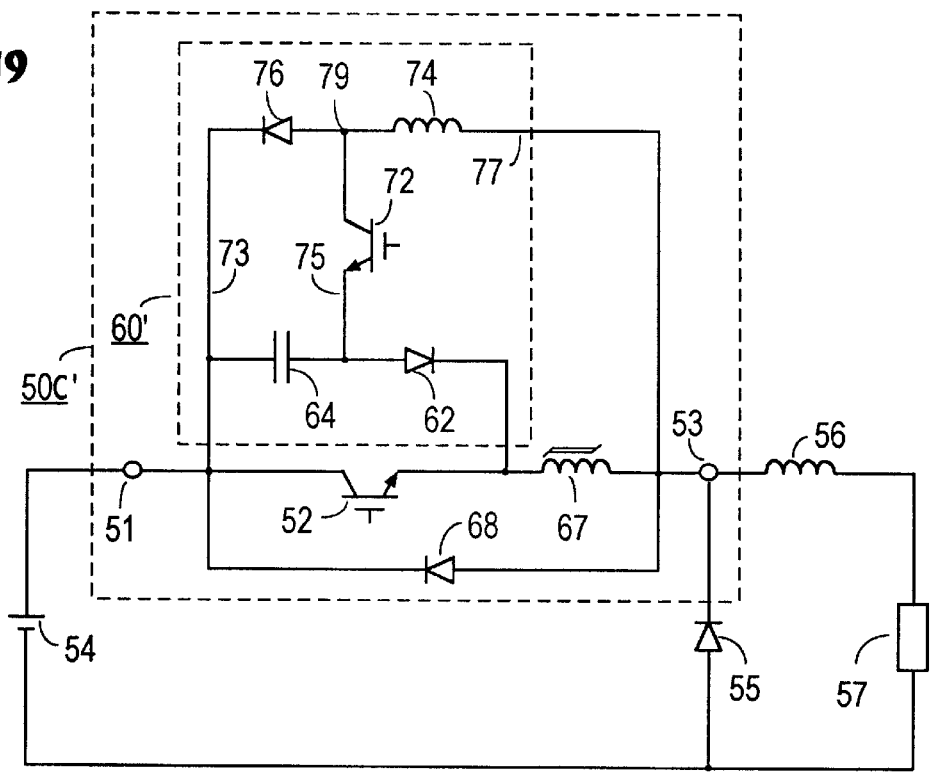
FIG. 19 illustrates a buck converter employing the soft switch of FIG. 16.

The detail operation of soft switch 50C' will now be explained with reference to FIG. 19, where soft switch 50C' is employed in a buck converter. Soft switch 50C' of FIG. 19 operates substantially the same as soft switch 50B' of FIG. 13. When switch 52 is turned on, saturable inductor 67 has high impedance and blocks the current path while allowing the voltage across switch 52 to drop rapidly. As a result, the turn-on loss of switch 52 due to voltage and current crossover is substantially reduced. When saturable inductor 67 switches from high impedance to low impedance (saturation), the switch current in switch 52 starts to increase rapidly. Once the switch current equals to the current in filter inductor 56, diode 55 turns off. The switch current keeps increasing until diode 55 is fully recovered from reverse recovery. In practice saturable inductor 67 has a small inductance at low impedance. The excess current hold by saturable inductor 67 with this small inductance will be carried by circling diode 68. The circulating energy in elements 52, 67 and 68 is substantially smaller than that in FIG. 13 due to the small inductance. However there is also only small limit on the reverse recovery current of diode 55.

Figure 18:
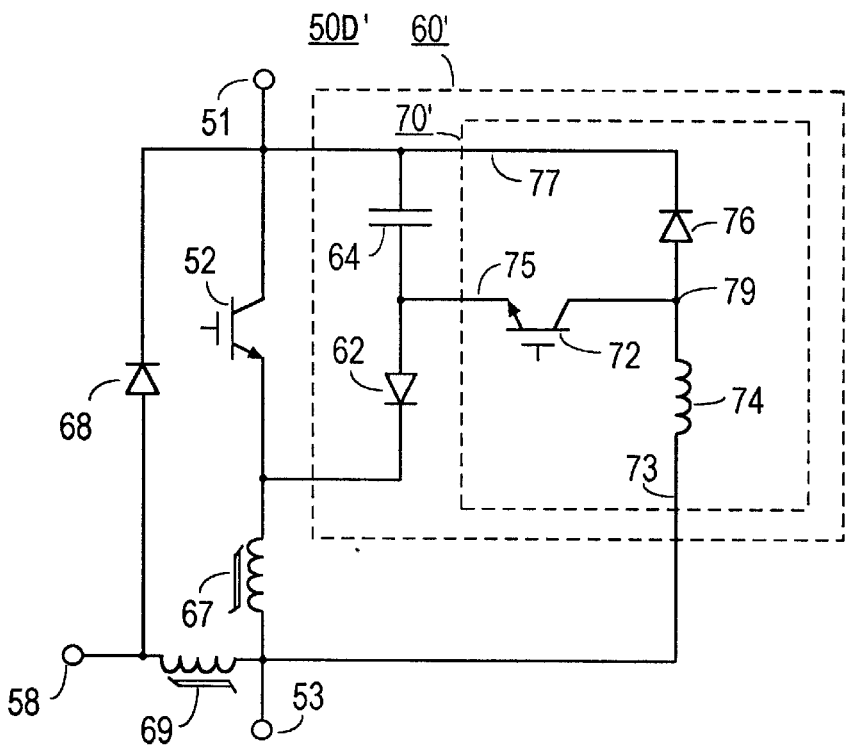
FIG. 18 is an electronically equivalent circuit or a dual-circuit of FIG. 17.
Figure 20:
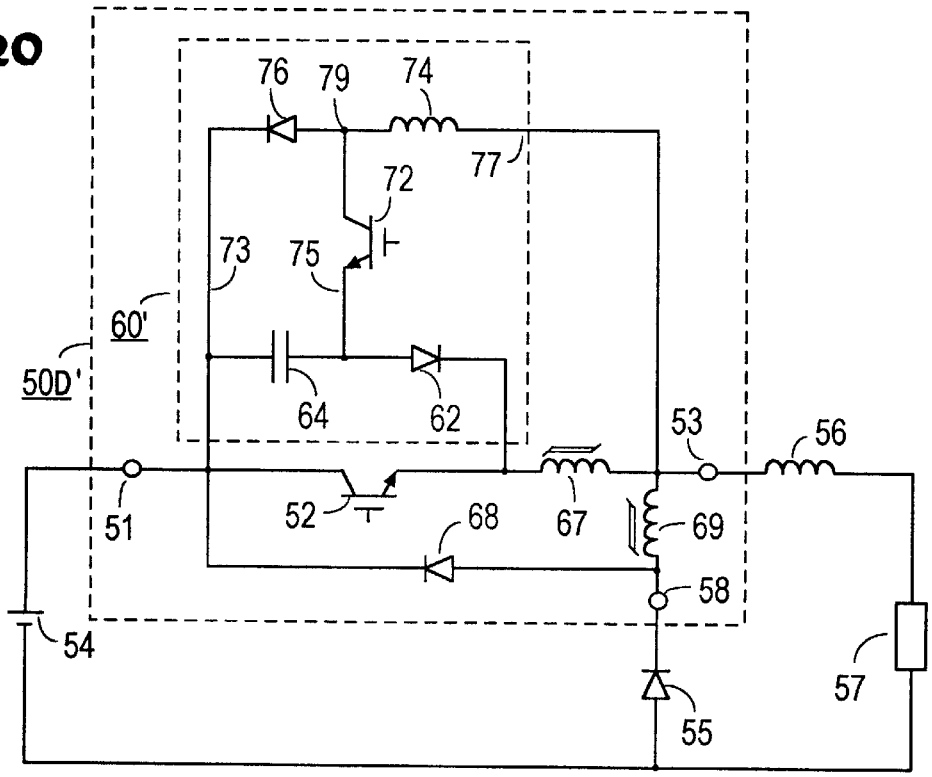
FIG. 20 illustrates a buck converter employing the soft switch of FIG. 18.

FIG. 20 shows a buck converter employing a soft switch 50D' as shown in FIG. 18, which provides limit on the reverse recovery current of diode 55. Soft switch 50D' of FIG. 18 is derived from soft switch 50C' of FIG. 16. A second saturable inductor 69 is inserted between saturable inductor 67 and circling diode 68. A diode terminal is added to the connection point of second saturable inductor 69 and circling diode 68 for connecting to diode 55. In operation, when the forward current in diode 55 reduces to zero, saturable inductor 69 blocks the reverse current and allows diode 55 to recover.

Figure 17:
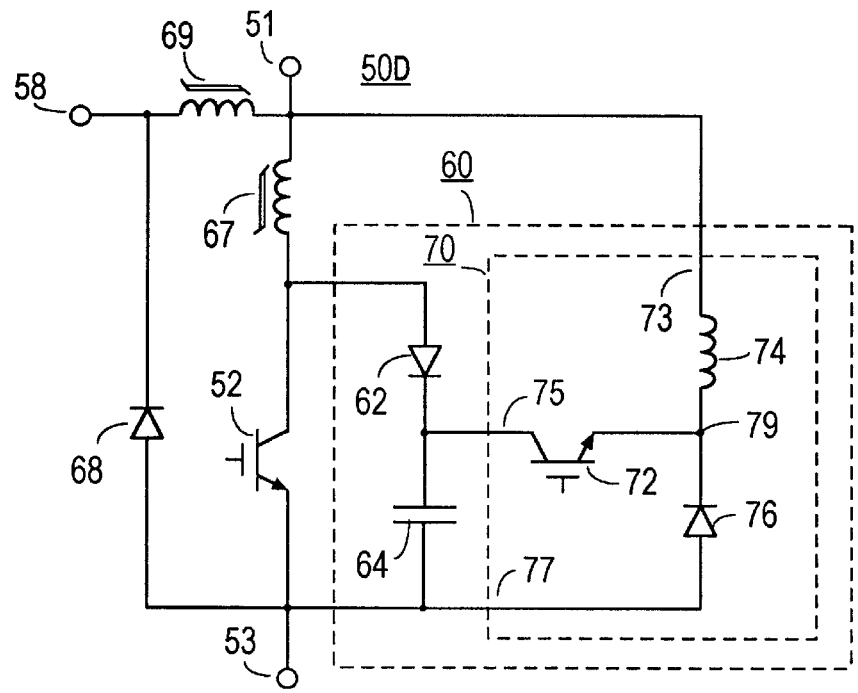
FIG. 17 shows a soft switch with two saturable inductors turn-on snubber.

FIG. 17 shows an electronically equivalent circuit or a dual-circuit of FIG. 18. Soft switch 50D of FIG. 17 is derived from soft switch 50C of FIG. 15, same as soft switch 50D' of FIG. 18 derived from soft switch 50C' of FIG. 16. Soft switch 50D of FIG. 17 operates substantially identical to soft switch 50D' of FIG. 18.

Although the detail operation of two pairs of basic soft switching active snubber 60, 60', 60a and 60a' has been illustrated and described in soft switches with a semiconductor switching element 52, the uses of soft switching active snubber are not so limited. According to the invention, the soft switching active snubber can be used as a stand-alone device for reducing the switching loss, voltage spike and switching noise across any switching elements, diodes, mechanical switches, relays and electronic circuits.

Figure 21:
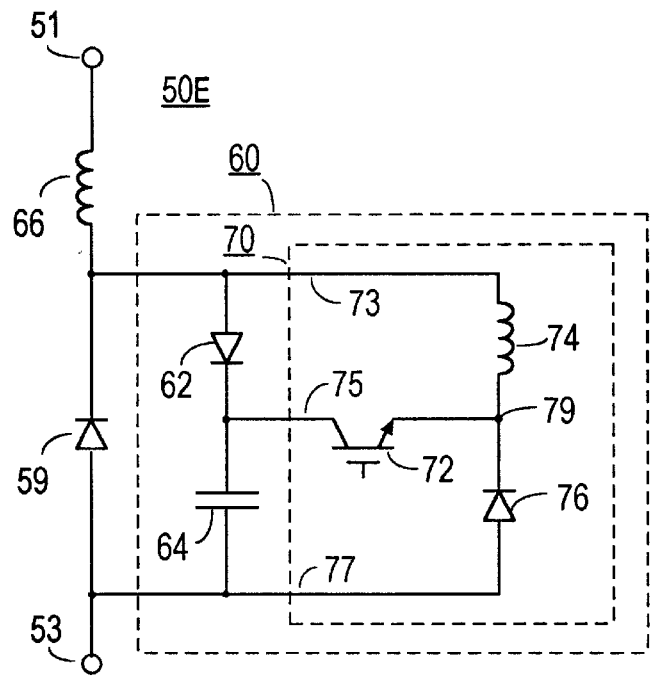
FIG. 21 is a circuit diagram of a soft switching active snubber with a diode.

FIG. 21 shows soft switching active snubber 60 coupled to a diode 59 for providing soft switching characteristic for diode 59. Inductor 66 limits the current surge due to the reverse recovery of diode 59. The combination of active snubber 60, diode 59 and inductor 66 represents a new soft switching element 50E.

Figure 23:
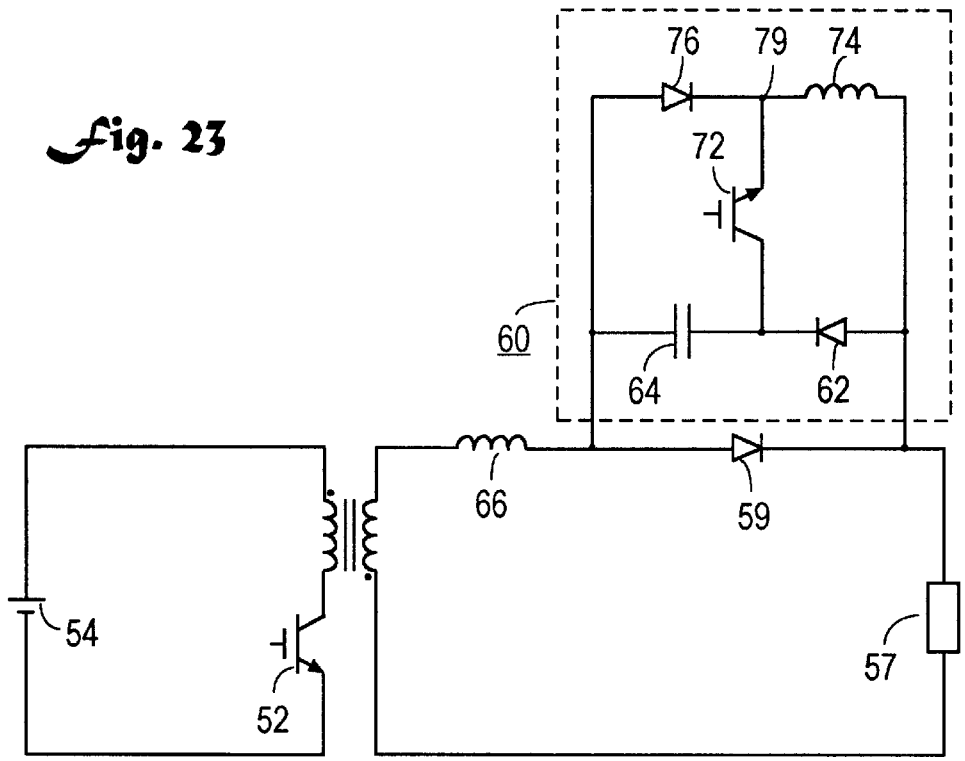
FIG. 23 illustrates a flyback converter employing the soft switch of FIG. 21.

The detail operation of soft switching element 50E will now be explained with reference to FIG. 23, where soft switch 50E is employed in a flyback converter. Assume that initially current in inductor 66 is zero, switch 52 is on and capacitor 64 has an initial voltage. When switch 52 turns off, diode 59 and snubber switch 72 turn on. Capacitor 64 discharges through snubber switch 72 and inductor 74. The discharging process of active snubber 60 is the same as described in FIG. 1. When switch 52 turns on, diode 59 starts to turn off. Once the forward current in diode 59 reaches zero, diode 59 becomes reverse conducted due to the reverse recovery. The reverse recovery current is limited by inductor 66 and the current surge is substantially reduced. Capacitor 64 limits the rate of reverse voltage increase and reduces the voltage stress on diode 59, when diode 59 is finally turned off from reserve recovery. The energy in inductor 66 will be absorbed by capacitor 64 until a forward current in inductor 66 equal to the current in inductor 74 is established. The remaining energy in inductors 66 and 74 is then transferred to load 57.

Figure 22:
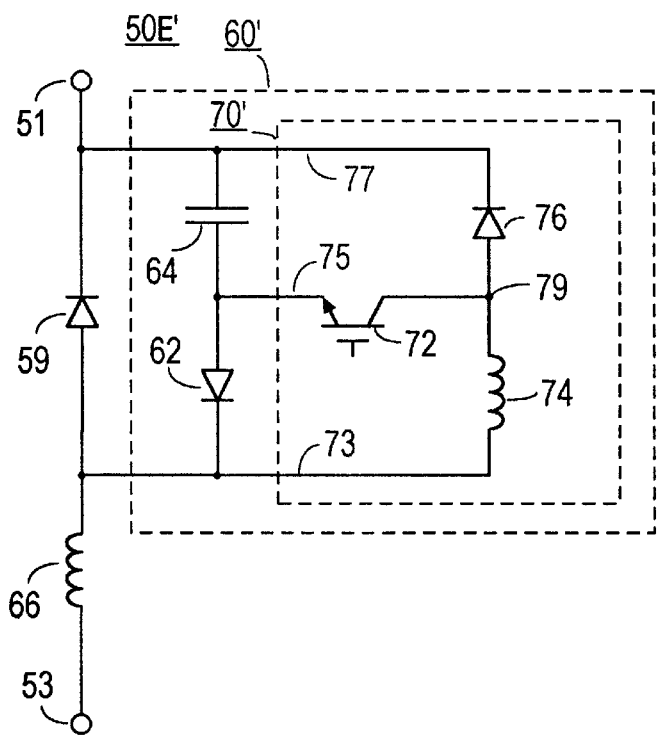
FIG. 22 is an electronically equivalent circuit or a dual-circuit of FIG. 21.

FIG. 22 shows an electronically equivalent circuit or a dual-circuit of FIG. 21. Soft switching element 50E' of FIG. 22 operates substantially identical to soft switching element 50E of FIG. 21.

Figure 24:
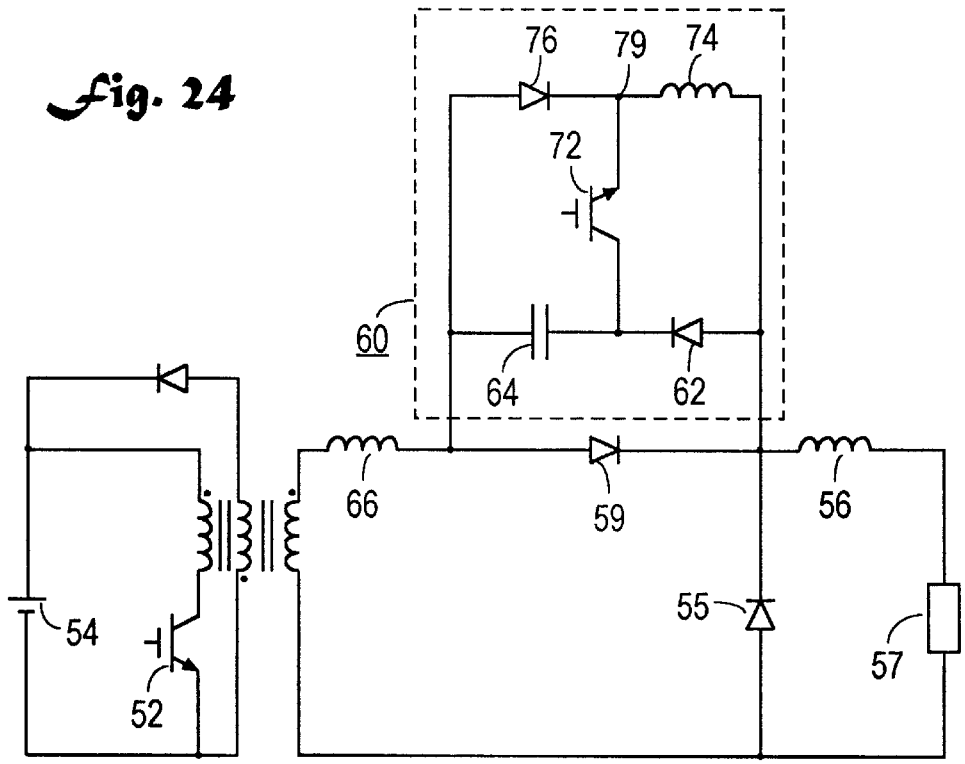
FIG. 24 illustrates a forward converter employing the soft switch of FIG. 21.

In FIG. 24 soft switching element 50E is employed in a forward converter. It provides switching loss and voltage spike reduction for diode 59. It is clear that active snubber 60 can also be used with diode 55 (not shown in FIG. 24). The use of soft switching elements 50E and 50E' are not limited to the applications as shown in FIGS. 23 and 24. They can also be used as soft switching rectifiers in any applications where rectifiers are needed. They can be used in series or in parallel.

According to the invention, active snubber 60s and soft switching element 50s introduce a new kind of standard components for power electronics. They can be used in series, in parallel or in different combinations. The combinations can take many variations and simplifications. FIGS. 25 to 29 show some of the variations and simplifications when soft switching elements are employed in combinations for providing stress relief for a half-bridge pole.

Figure 25:
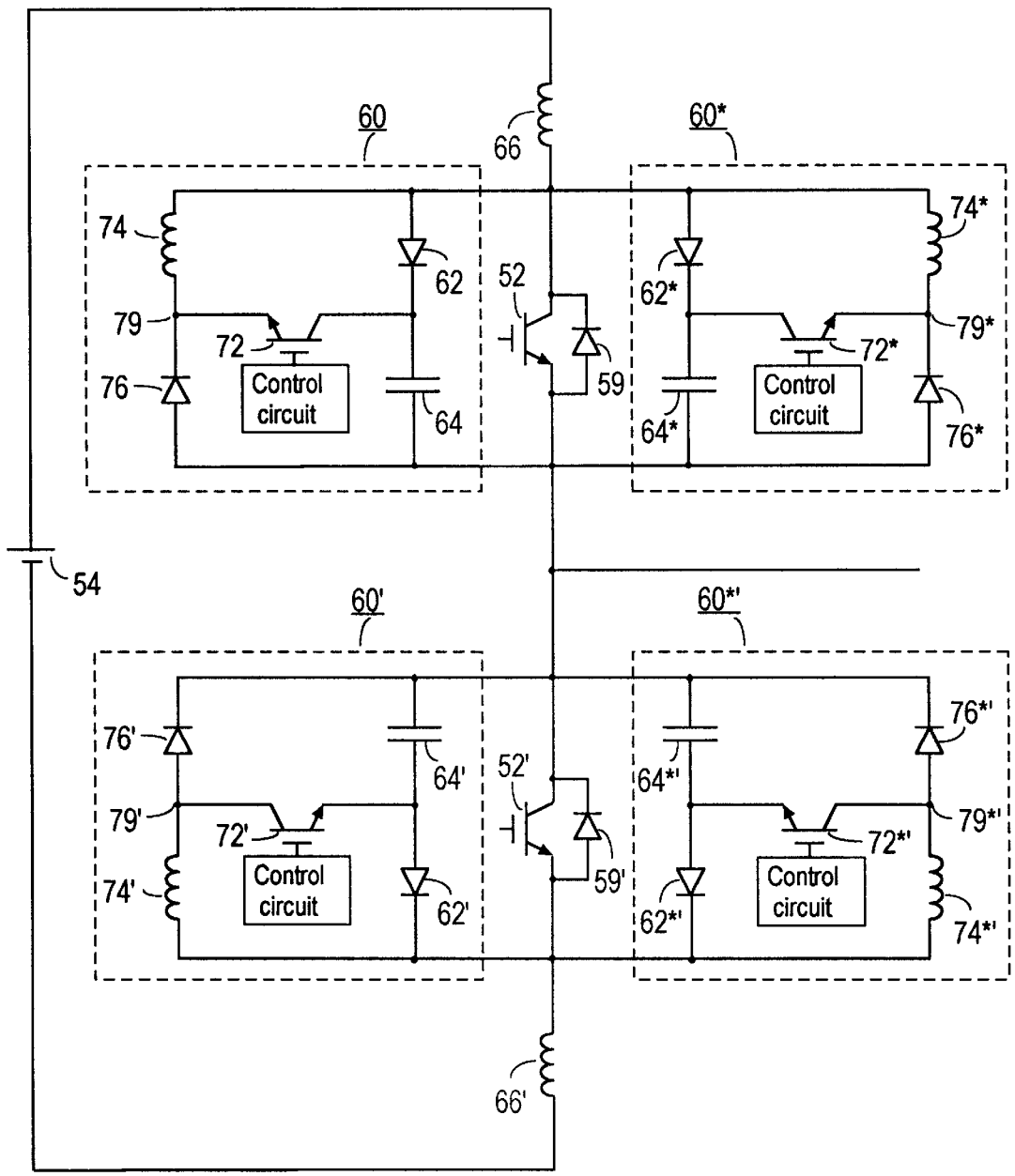
FIGS. 25 to 30 illustrate a half-bridge pole employing various forms of active snubbers according to the invention.

In FIG. 25 a combination of four active snubbers with two inductors provides a complete switching stress relief for the switching elements 52, 52' and diodes 59, 59'. Inductors 66 and 66' are turn-on snubbers which substantially reduce the turn-on switching losses of switches 52, 52' and the current surges due to the reverse recovery of diodes 59, 59'. The combination of active snubber 60 and 60* operates substantially identical to the combination of active snubber 60' and 60*'. Since reverse recovery current of diode 59 is substantially smaller than load current carried by switch 52, the sizes of capacitors 64 and 64* are designed accordingly. Active snubber 60 is designed and controlled to be fully discharged when switch 52 is turned on with a full duty cycle and load current. The turn-off switching loss and voltage spike are substantially reduced by active snubber 60 when switch 52 is turned off. The voltage spike is clamped by active snubber 60 when diode 59 is turned off from reverse recovery. Active snubber 60* is designed and controlled to be discharged quickly whenever switch 52 or diode 59 is turned on. The rate of voltage increase across diode 59 is limited by snubber 60* when diode 59 is turned off from reverse recovery. The turn-off switching loss of switch 52 is also reduced by active snubber 60* when switch 52 is turned off at light and full load operating conditions.

As described previously, one of the unique features of the active snubber is that snubber switch 72 allows more controls to the snubber. To provide the controls required by the above described operations, many different control methods can be implemented. The control circuit for active snubber 60* includes a voltage sensing circuit, for generating a signal proportional to voltage across the rectifier 62*, and a circuit for comparing the voltage signal to a predetermined turn-on voltage level and a predetermined turn-off voltage level, and providing a signal to turn on snubber switch 72* when the voltage signal is above the turn-on voltage level and to turn off snubber switch 72* when the voltage signal is below the turn-off voltage level. With such control circuit, snubber switch 72* will be turned on to discharge active snubber 60* whenever switch 52 or diode 59 is on. Same control is used for active snubber 60*'.

The control method described above can be used in all active snubbers for different applications. Three advantages are provided by this control method. In power converter applications where a single switching element is used, it simplifies the snubber circuit by not requiring a control signal from the switching element. In bridge power converter applications where two switching elements in one leg are turned on and off alternately in one switching cycle, the discharging process of the snubber circuit in one switching element starts immediately after other switching element is turned off. This reduces switching transition time.

Furthermore the predetermined turn-on or turn-off voltage can be tied to the load current such that the discharging process is responsive to the load current. This extra control is needed in applications such as DC-DC converters operating in continuous mode where duty cycle does not change with load current.

In applications, such as the inverter circuits, where the two switching elements in one leg are not turned on and off alternately in one switching cycle, another control method can be implemented. The control circuit starts the discharging process of active snubber 60 in according with a turn-on signal of the corresponding switch 52. An unnecessary discharging of the active snubber 60 at the turn-off of the other switch 52' is avoided. Since active snubber 60 also provides voltage spike clamping for diode 59, additional control is needed to discharge the surplus energy absorbed by active snubber 60. The control circuit includes a voltage sensing circuit, for generating a signal proportional to voltage across the rectifier 62, and a circuit for comparing the voltage signal to a predetermined turn-on voltage range and a predetermined turn-off voltage level, and providing a signal to turn on snubber switch 72 when the voltage signal is in the turn-on voltage range and to turn off snubber switch 72 when the voltage signal is below the turn-off voltage level. With such control circuit, snubber switch 72 will be turned on to discharge active snubber 60 when switch 52 and diode 59 are off and the voltage of capacitor 64 is higher than a predetermined level. Same control is used for active snubber 60'.

One important inherent feature of the active snubber makes it particularly suitable for inverter circuit applications. In most of the inverter circuit applications, the load current is proportional to the switching duty cycle. The active snubber is designed to be fully discharged when the corresponding switch is turned on with a full duty cycle. The maximum switching loss reduction is provided at full load current when the corresponding switch is turned off. The snubber switch is controlled by the same control signal of the corresponding switch. Therefore the discharge of the active snubber is proportional to the switching duty cycle of the corresponding switch. A partially discharged active snubber provides a proportional switching loss reduction at a smaller switching duty cycle and load current. In other words the active snubber can be controlled to act as a capacitor with variable capacitance. The effective capacitance varies in corresponding to the load current. In doing so two extra operating modes in all capacitive turn-off snubbers when they are used in the half-bridge pole can be eliminated or kept at the minimum.

As described previously, an extra operation mode is added to the power converting operation of the switch as shown in FIG. 3 by the duration t2 to t3. At light load this duration can become substantially large. With the proportional control, a smaller current corresponding to a smaller switching duty cycle only needs to charge a partially discharged snubber capacitor. The duration t2 to t3 is therefore kept at the minimum.

Referring to FIG. 25, if capacitor 64 is only partially charged when switch 52' is turned on, an extra operation mode to charge capacitor 64 by switch 52' will be added. An unnecessary current stress will be added to switch 52'. A proper design with the proportional control can eliminate such extra operation mode by allowing capacitor 64 to be fully charged before switch 52' is turned on.

Figure 26:
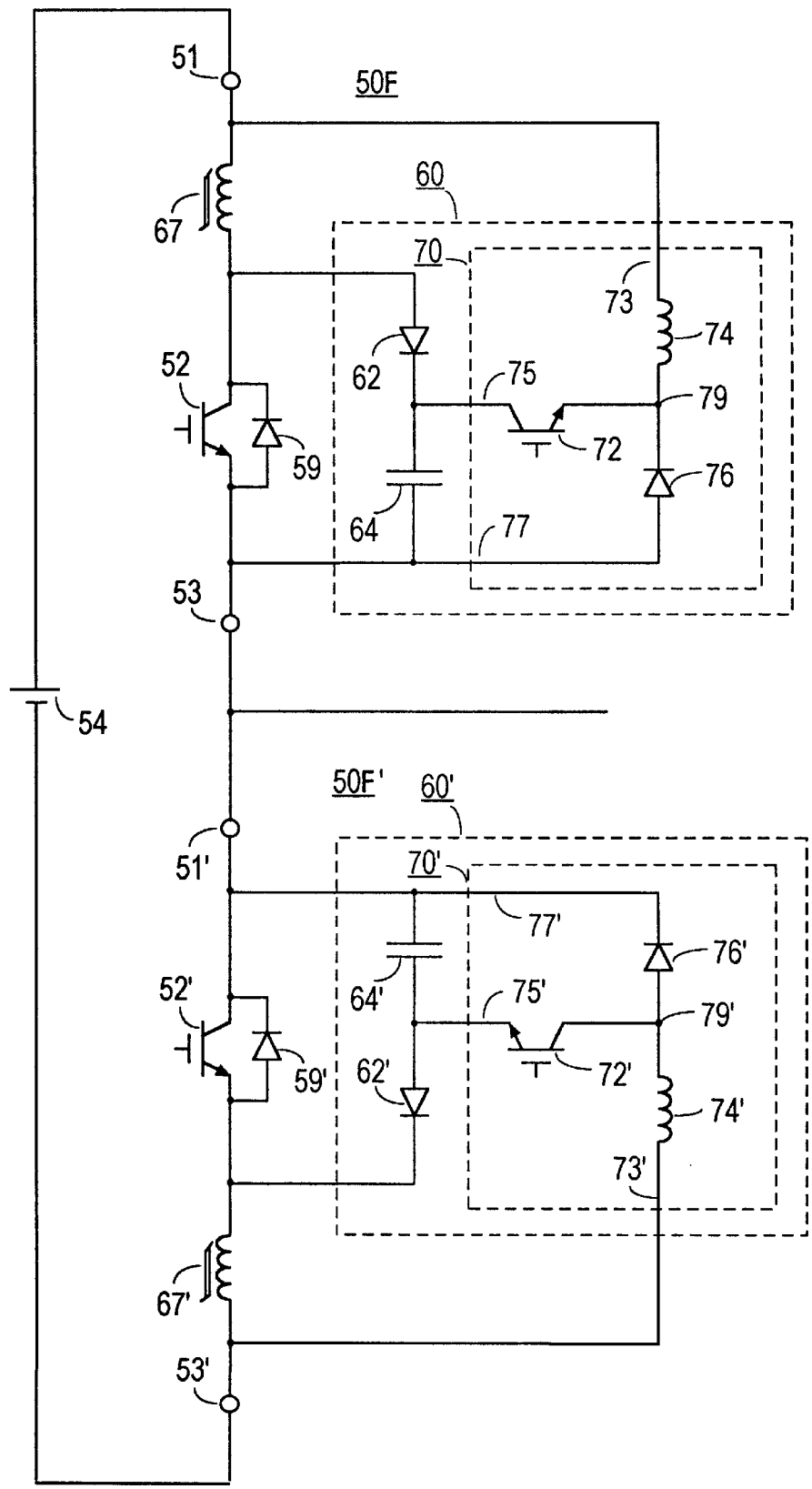
Figure 27:
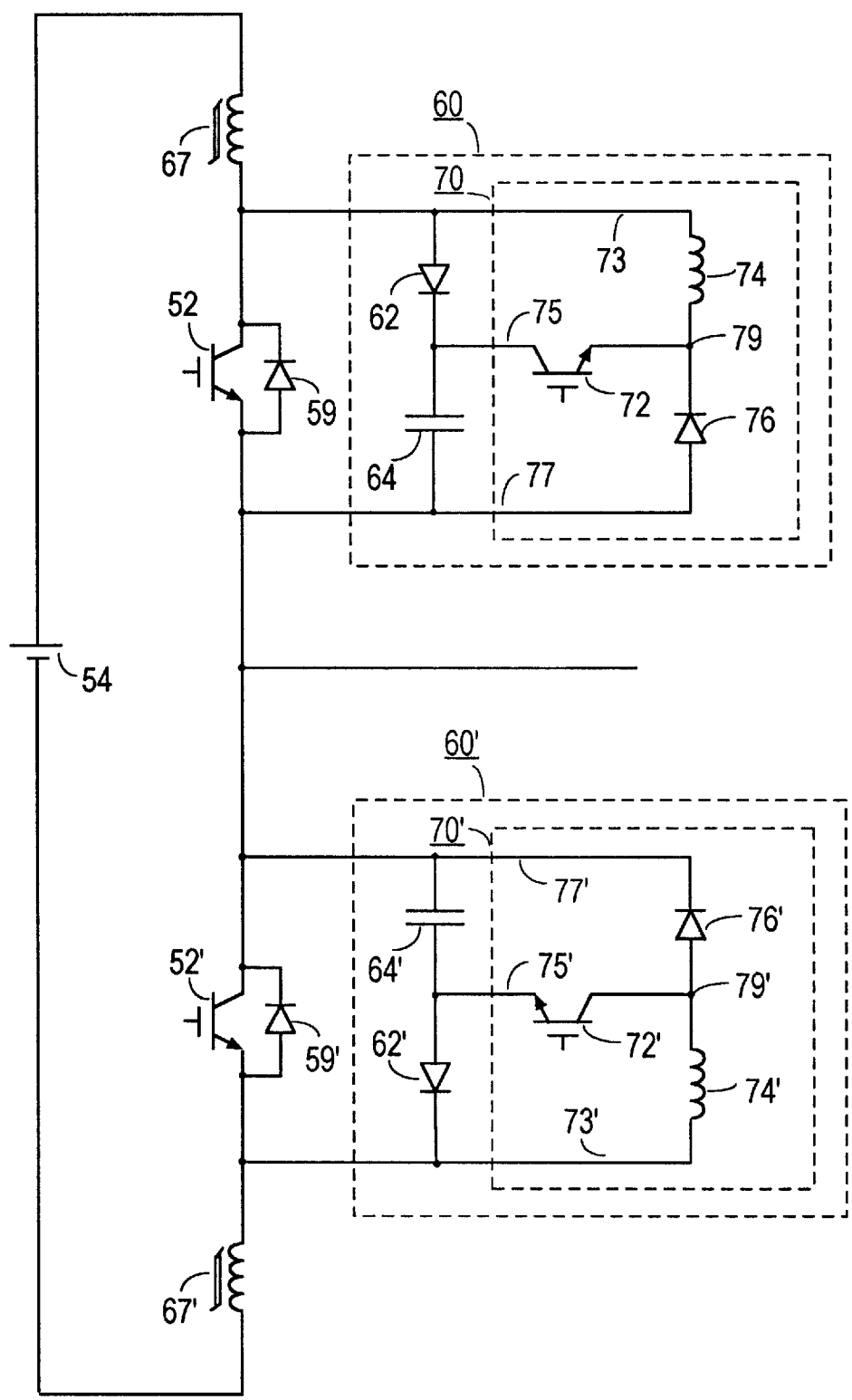
Figure 28:
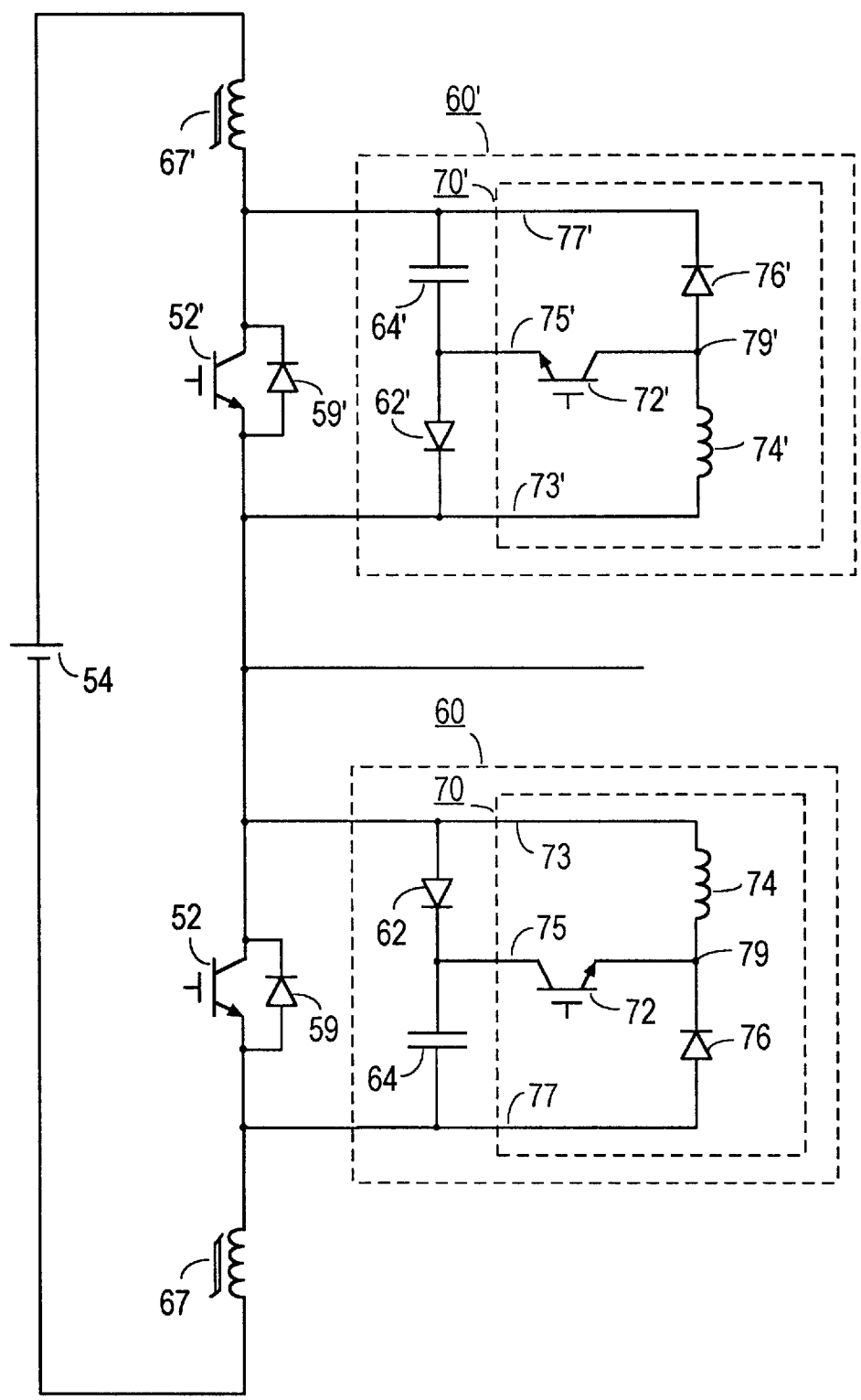
Figure 29:
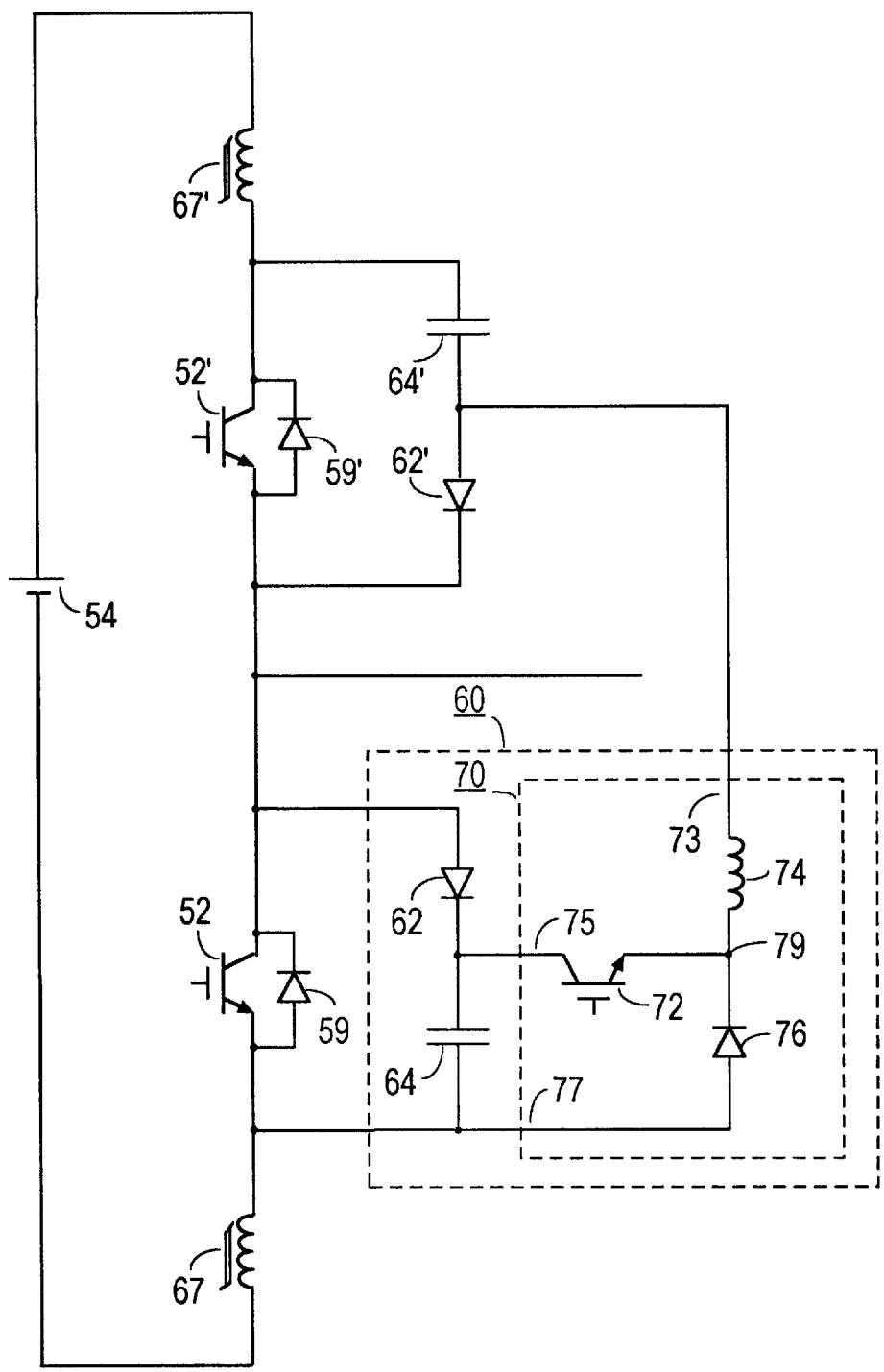
Figure 30:
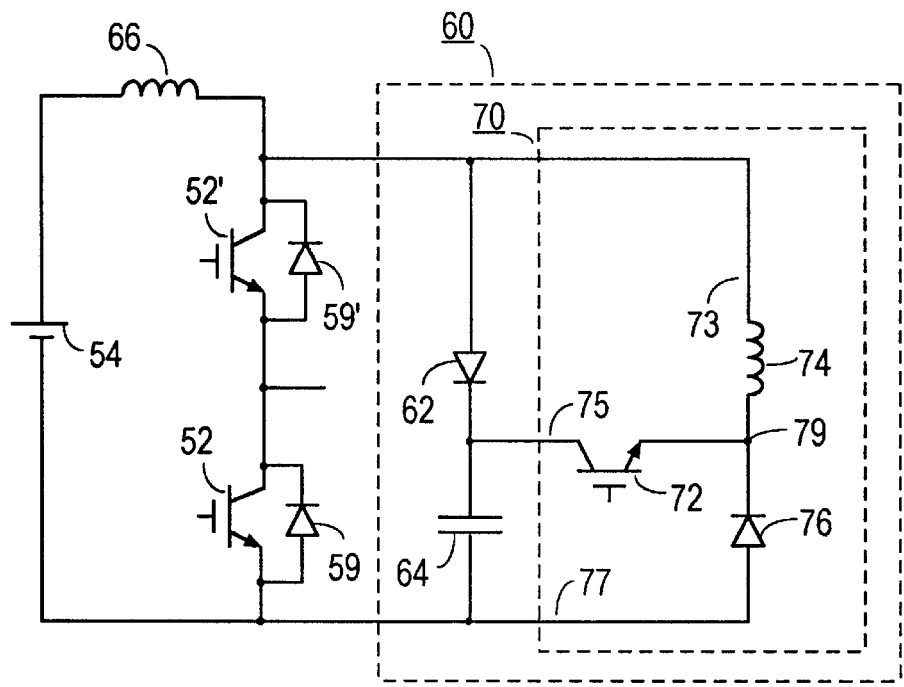
Figure 31:
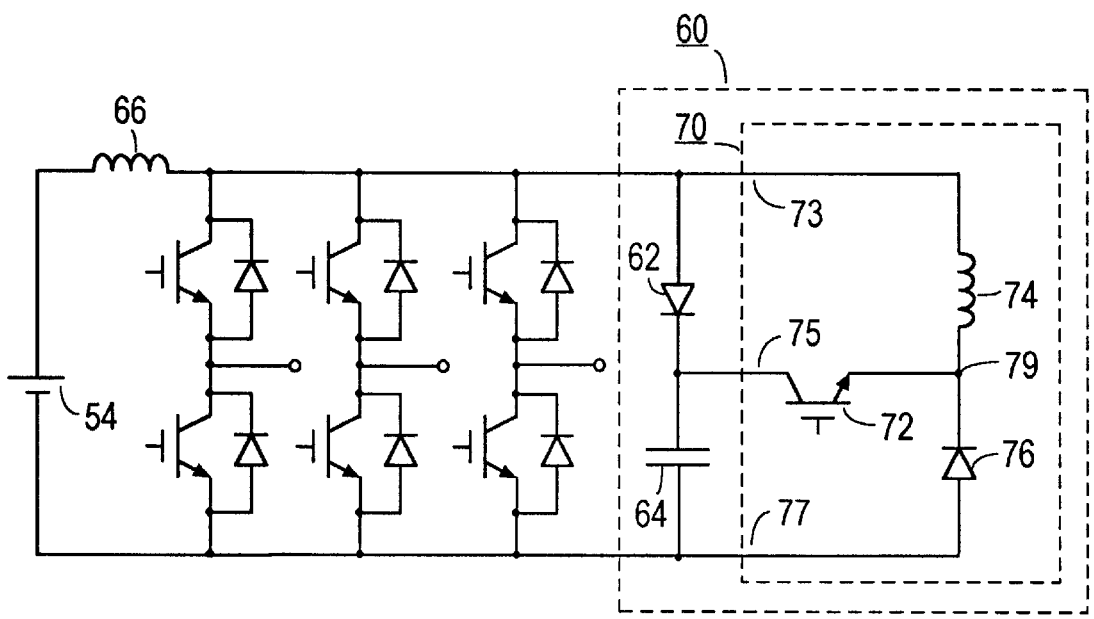
FIG. 31 illustrates a three-phase inverter employing the active snubber.
Figure 32:
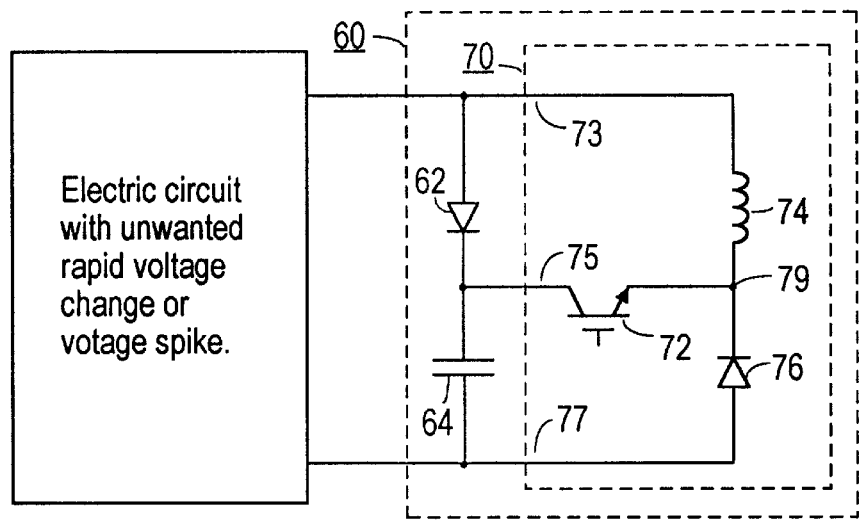
FIG. 32 illustrates an electric circuit employing the active snubber.

It should be noted that the inductors 66 and 66' may be saturable reactors to minimize the snubber energy and may be coupled magnetically. Since active snubbers 60 and 60' provide adequate stress relief for switches 52, 52' and diodes 59, 59', in most applications simplified circuits as shown in FIGS. 26 to 28 can be used. For the applications where two switches in the half-bridge pole always turn on and off alternately in one switching cycle, a more simplified circuit as shown in FIG. 29 can be used. Active snubber 60 can also be used to provide only voltage spike clamping for half-bridge power switch module or three-phase power switch module as shown in FIGS. 30 and 31. In general active snubber 60 can be used to provide voltage smoothing for any electric circuits with unwanted rapid voltage change or voltage spike as shown in FIG. 32. The control method can be the same used in active snubber 60 that provides voltage spike clamping for diode 59 in FIG. 25.

Figure 33:
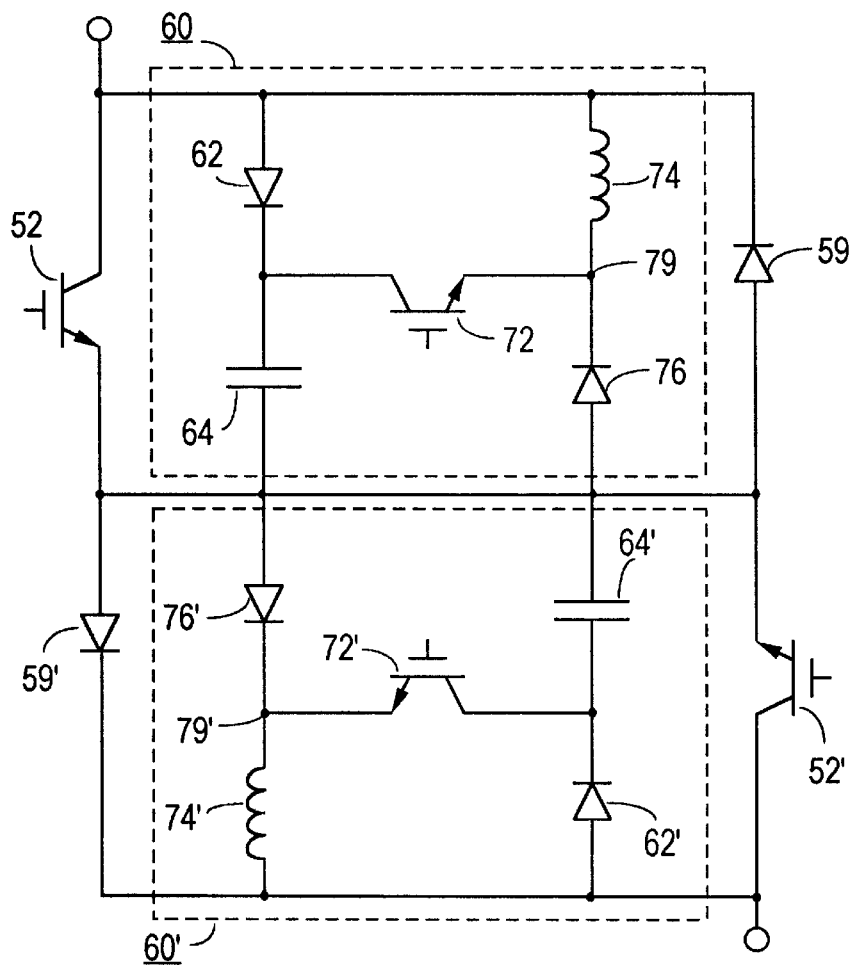
FIG. 33 illustrates a bi-directional soft switch.

In FIG. 33 the active snubbers are employed in a bi-directional switch application. Active snubbers 60 and 60' reduce the turn-off switching loss and voltage spike for switches 52 and 52' respectively. Each active snubber operates in the same manner as the active snubber shown in FIG. 1. The reverse current path for energy recovery and snubber reset of each snubber is provided by the complement switch.

Although this invention has been described in at least one preferred form with a certain degree of particularity, it is to be understood that the present disclosure of the preferred embodiment should be considered illustrative of the invention only and not as limiting the scope of the invention, it will be apparent to those skilled in the art that suitable modifications, variations, arrangement of components and numerous changes in the detail may be made therein without departing from the spirit and scope of the invention as construed in accordance with the accompanying claims.

What is claimed is:

1. A reliable snubber for providing stress relief for a switching element comprising:

a capacitor for energy absorbing;

rectifying means, coupled in series with said capacitor, the series combination being coupled across the switching element, for providing stress relief for the switching element; and soft switching active reset means, having first, second and third terminals, wherein the first terminal is coupled to a connection point of the switching element and said rectifying means, the second terminal is coupled to a connection point of said capacitor and said rectifying means, for providing a controllable discharging path, and the third terminal is coupled to a connection point of the switching element and said capacitor, for providing a recovering path;

so that a controllable discharging and recovering process of said capacitor is provided by said soft switching active reset means.

2. The reliable snubber of claim 1 wherein said soft switching active reset means comprises:

inductor means, having a first side coupled to said first terminal of the reset means and a second side;

snubber switching means, coupled between said second terminal of the reset means and said second side of said inductor means, for providing a controllable discharging path for said capacitor; and a clamping diode, coupled between said third terminal of the reset means and said second side of said inductor means, for providing a soft switching turn-off characteristic for said snubber switching means, and a path to recover the energy transferred to said inductor means during the discharging process of said capacitor.

3. The reliable snubber of claim 2 wherein said switching element is one of an IGBT switch, a GTO switch, a BJT switch and a MCT switch.

4. The reliable snubber of claim 3 wherein said snubber switching means is one of a BJT switch, an IGBT switch and a MCT switch.

5. The reliable snubber of claim 4 further including a second inductor means, coupled in series with the switching element, for energy absorbing.

6. The reliable snubber of claim 5 further including a circling diode, coupled across the switching element and said second inductor means, for voltage clamping.

7. The reliable snubber of claim 6 wherein said second inductor means includes a saturable inductor.

8. The reliable snubber of claim 4 wherein said inductor means includes an inductor.

9. The reliable snubber of claim 4 wherein said inductor means comprises:

a transformer having a primary winding and a secondary winding, said primary winding having a first end coupled to said first terminal of the reset means and a second end coupled to a connection point of said clamping diode and said snubber switching means;

an inductor, coupled in series with said secondary winding; and recovering means, coupled to said inductor, for recovering energy from said inductor to an external source.

10. A soft switching device having a control terminal and two main current terminals, for providing efficient and reliable power switching for a power conversion circuit, comprising:

a switching element having a control electrode connected to said control terminal of the soft switching device and two current electrodes; and a soft switching active snubber, attached to the switching element, for providing a soft switching condition for the switching element;

said soft switching active snubber comprising:

a capacitor for energy absorbing, having a first plate and a second plate, said first plate of said capacitor connected to a first one of the two current electrodes of the switching element and a first one of the two main current terminals of the soft switching device;

inductor means for energy recovering, having a first side and a second side, said first side of said inductor means connected to a second one of the two main current terminals of the soft switching device and a second one of the two current electrodes of the switching element; and semiconductor device means, having a first terminal and a capacitor terminal, an inductor terminal and a second terminal, said first terminal of the device means being connected to the second one of the two current electrodes of the switching element, and said capacitor terminal of the device means being connected to said second plate of said capacitor, such that upon turn-off of the switching element said capacitor provides a soft switching condition for the switching element by absorbing energy, said inductor terminal of the device means being connected to said second side of said inductor means such that upon receipt of a reset signal energy held by said capacitor is transferred to said inductor means, said second terminal of the device means being connected to said first plate of said capacitor such that a controllable soft switching reset process is provided for said capacitor.

11. The soft switching device of claim 10 wherein said semiconductor device means comprises:

a rectifying means, connected between said first terminal of the device means and said capacitor terminal of the device means;

snubber switching means, connected between said capacitor terminal of the device means and said inductor terminal of the device means, for providing a controllable discharging path for said capacitor; and a clamping diode, connected between said second terminal of the device means and said inductor terminal of the device means, for providing a soft switching turn-off characteristic for said snubber switching means and a path to recover the energy transferred to said inductor means during the discharging process of said capacitor means.

12. The soft switching device of claim 11 wherein said snubber switching means includes:

a snubber switching element, for controlling energy removal from said capacitor; and control means, connected to a control input of said snubber switching element, for selectively turning on and turning off said snubber switching element.

13. The soft switching device of claim 12 further including second inductor means, inserted between one of the two main current terminals of the soft switching device and one of the two current electrodes of the switching element, for current limiting.

14. The soft switching device of claim 13 further including a circling diode, connected across two main current terminals of the soft switching device for voltage clamping.

15. The soft switching device of claim 14 further including:

> third inductor means, inserted in series with said circling diode, for current limiting; and
>
> a diode terminal, connected to a connection point of said third inductor means and said circling diode, for connecting to an external diode.

16. The soft switching device of claim 15 wherein said second inductor means includes a saturable inductor, and said third inductor means includes a saturable inductor.

17. A bi-directional switch assembly for switching bi-directional power comprising:

> first and second soft switching devices, each as described in claim 12, connected in a reverse series connection; and
>
> first and second reverse diodes, connected in parallel with each said first and second soft switching devices;
>
> so that said first soft switching device and said second reverse diode provides a forward current path, and said second soft switching device and said first reverse diode provides a reverse current path.

18. A half-bridge pole assembly for use in one of a single-phase inverter, a three-phase inverter and a DC-DC converter comprising:

> DC power means for providing DC power; and
>
> first and second soft switching devices, each as described in claim 13, connected in series across said DC power means;
>
> so that a converted AC output power is provided at a point between said first and second soft switching devices.

19. The half-bridge pole assembly of claim 18 further including a reverse diode connected in parallel with each said first and second soft switching devices.

20. A soft switching active reset circuit having a capacitor terminal, a capacitor main terminal and a rectifier main terminal, the two capacitor terminals coupled to a snubber capacitor, the two main terminals coupled to a switching circuit for providing stress relief comprising:

> rectifying means, coupled between said capacitor terminal and said rectifier main terminal, for directing charge and discharge current path;
>
> inductor means, having a first side coupled to said rectifier main terminal and a second side, for recovering absorbed energy from the snubber capacitor;
>
> snubber switching means, coupled between said capacitor terminal and said second side of said inductor means, for providing a controllable soft switching discharging and recovering process of the snubber capacitor; and
>
> a clamping diode, coupled between said capacitor main terminal and said second side of said inductor means, for providing a soft switching turn-off characteristic for said snubber switching means, and a path to recover the energy transferred to said inductor means during the discharging process of the snubber capacitor;
>
> so that a versatile, reliable and efficient soft switching reset circuit provides an intelligent resetting process for the snubber capacitor.

* * * * *